(12) United States Patent
Kim

(10) Patent No.: US 10,770,289 B2
(45) Date of Patent: Sep. 8, 2020

(54) SYSTEMS AND METHODS FOR GRAPHENE BASED LAYER TRANSFER

(71) Applicant: Massachusetts Institute of Technology, Cambridge, MA (US)

(72) Inventor: Jeehwan Kim, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/914,295

(22) Filed: Mar. 7, 2018

(65) Prior Publication Data

US 2018/0197736 A1 Jul. 12, 2018

Related U.S. Application Data

(63) Continuation of application No. PCT/US2016/050701, filed on Sep. 8, 2016.
(Continued)

(51) Int. Cl.
*H01L 21/02* (2006.01)
*H01L 33/00* (2010.01)

(52) U.S. Cl.
CPC .... *H01L 21/02444* (2013.01); *H01L 21/0254* (2013.01); *H01L 21/02378* (2013.01); *H01L 21/02425* (2013.01); *H01L 21/02499* (2013.01); *H01L 21/02546* (2013.01); *H01L 21/02642* (2013.01); *H01L 21/02647* (2013.01);
(Continued)

(58) Field of Classification Search
None
See application file for complete search history.

(56) References Cited

U.S. PATENT DOCUMENTS 4,236,947 A  12/1980  Baliga
4,727,047 A   2/1988  Bolzer et al.
(Continued)

FOREIGN PATENT DOCUMENTS

WO  WO 2013/088948 A1  6/2013
WO  WO 2014/190352 A1  11/2014
(Continued)

OTHER PUBLICATIONS

International Search Report and Written Opinion dated Jan. 19, 2017 for International Application No. PCT/US2016/050701, 12 pages.
(Continued)

*Primary Examiner* — Walter H Swanson
*Assistant Examiner* — Kien C Ly
(74) *Attorney, Agent, or Firm* — Wolf, Greenfield & Sacks, P.C.

(57) ABSTRACT

A graphene-based layer transfer (GBLT) technique is disclosed. In this approach, a device layer including a III-V semiconductor, Si, Ge, III-N semiconductor, SiC, SiGe, or II-VI semiconductor is fabricated on a graphene layer, which in turn is disposed on a substrate. The graphene layer or the substrate can be lattice-matched with the device layer to reduce defect in the device layer. The fabricated device layer is then removed from the substrate via, for example, a stressor attached to the device layer. In GBLT, the graphene layer serves as a reusable and universal platform for growing device layers and also serves a release layer that allows fast, precise, and repeatable release at the graphene surface.

23 Claims, 22 Drawing Sheets

Related U.S. Application Data

(60) Provisional application No. 62/361,717, filed on Jul. 13, 2016, provisional application No. 62/335,784, filed on May 13, 2016, provisional application No. 62/215,223, filed on Sep. 8, 2015.

(52) U.S. Cl.
CPC ...... *H01L 21/02658* (2013.01); *H01L 33/007* (2013.01); *H01L 33/0066* (2013.01); *H01L 33/0093* (2020.05)

(56) References Cited

U.S. PATENT DOCUMENTS

| | | | |
|---|---|---|---|
| 5,114,745 | A | 5/1992 | Jones |
| 5,308,661 | A | 5/1994 | Feng et al. |
| 5,349,922 | A | 9/1994 | Anthony et al. |
| 5,527,559 | A | 6/1996 | Simpson |
| 5,641,381 | A | 6/1997 | Bailey et al. |
| 5,792,254 | A | 8/1998 | Windischmann |
| 6,566,256 | B1 | 5/2003 | Solomon et al. |
| 8,906,772 | B2 | 12/2014 | Sumant |
| 8,916,451 | B2 | 12/2014 | Bayram et al. |
| 9,096,050 | B2 | 8/2015 | Bedell et al. |
| 9,991,113 | B2 | 6/2018 | Kim et al. |
| 10,517,155 | B2 | 12/2019 | Lee et al. |
| 2005/0109918 | A1 | 5/2005 | Nikzad et al. |
| 2006/0021565 | A1 | 2/2006 | Zahler et al. |
| 2007/0187694 | A1 | 8/2007 | Pfeiffer |
| 2009/0045395 | A1 | 2/2009 | Kim et al. |
| 2009/0162549 | A1 | 6/2009 | Fryda et al. |
| 2009/0236619 | A1 | 9/2009 | Chakroborty |
| 2010/0224950 | A1 | 9/2010 | Dinyari et al. |
| 2011/0030991 | A1 | 2/2011 | Veerasamy |
| 2011/0108954 | A1 | 5/2011 | Spiberg et al. |
| 2011/0244662 | A1 | 10/2011 | Lee et al. |
| 2011/0294281 | A1 | 12/2011 | Zang et al. |
| 2012/0141799 | A1 | 6/2012 | Kub et al. |
| 2012/0238083 | A1 | 9/2012 | Pan |
| 2013/0001731 | A1 | 1/2013 | Forrest et al. |
| 2013/0143397 | A1 | 6/2013 | Fuller et al. |
| 2013/0285016 | A1 | 10/2013 | Wei et al. |
| 2013/0285115 | A1 | 10/2013 | Wei et al. |
| 2013/0316488 | A1 | 11/2013 | Bedell et al. |
| 2014/0001152 | A1 | 1/2014 | Zurutuza Elorza et al. |
| 2014/0038392 | A1 | 2/2014 | Yonehara et al. |
| 2014/0220764 | A1* | 8/2014 | Bayram ............ H01L 21/76251 438/458 |
| 2014/0339580 | A1 | 11/2014 | Park et al. |
| 2014/0342127 | A1 | 11/2014 | Dimitrakopoulos et al. |
| 2015/0084074 | A1 | 3/2015 | Bayram et al. |
| 2015/0122659 | A1 | 5/2015 | Kula et al. |
| 2015/0179968 | A1 | 6/2015 | Forrest et al. |
| 2015/0228728 | A1 | 8/2015 | Dimitrakopoulos et al. |
| 2016/0028022 | A1 | 1/2016 | Seo |
| 2016/0064489 | A1 | 3/2016 | Zhang et al. |
| 2016/0126317 | A1 | 5/2016 | Kim et al. |
| 2016/0268128 | A1 | 9/2016 | Cheng et al. |
| 2016/0329457 | A1 | 11/2016 | Forrest et al. |
| 2016/0333472 | A1 | 11/2016 | Xu et al. |
| 2016/0351747 | A1 | 12/2016 | Forrest et al. |
| 2017/0018614 | A1* | 1/2017 | Rupp ................. H01L 29/1608 |
| 2017/0352538 | A1 | 12/2017 | Kim et al. |
| 2019/0259608 | A1 | 8/2019 | Kim et al. |
| 2019/0386044 | A1 | 12/2019 | Lee et al. |
| 2020/0043790 | A1 | 2/2020 | Lee et al. |

FOREIGN PATENT DOCUMENTS

| | | |
|---|---|---|
| WO | WO 2016/058037 A1 | 4/2016 |
| WO | WO 2017/222796 A2 | 12/2017 |
| WO | WO 2018/195152 A1 | 10/2018 |
| WO | WO 2018/195412 A1 | 10/2018 |
| WO | WO 2019/099461 A1 | 5/2019 |

OTHER PUBLICATIONS

Kim, J. et al., "Principle of direct van der Waals epitaxy of single-crystalline films on epitaxial graphene," Nature Communications 2014; doi: 10.1038/ncomms5836, 7 pages.

Invitation to Pay Additional Fees mailed Oct. 19, 2016 for Application No. PCT/US2016/050701.

International Preliminary Report on Patentability dated Mar. 22, 2018 for Application No. PCT/US2016/050701.

Adams et al., Demonstration of multiple substrate reuses for inverted metamorphic solar cells. IEEE J Photovolt. 2013;3(2):899-903. 6 pages.

Ait-Mansour et al., Ge epitaxial island growth on a graphitized C-rich 4H—SiC(0 0 0 1) surface. J Cryst Growth. Feb. 2005;275(1-2):e2275-80. Epub Jan. 7, 2005.

Alaskar et al., Theoretical and experimental study of highly textured GaAs on silicon using a graphene buffer layer. J Crystal Growth. Sep. 1, 2015;425:268-73. Epub Feb. 9, 2015.

Avouris et al., Graphene: synthesis and applications. Materials Today. Mar. 2012;15(3):86-97.

Balmer et al., Chemical vapour deposition synthetic diamond: Materials, technology and applications. J Phys Condens Matter. Aug. 2009;21(346):364221(1-3).

Barton et al., Transition metal dichalcogenide and hexagonal boron nitride heterostructures grown by molecular beam epitaxy Microelectronic Engineering. 2015;147:306-9. doi: 10.1016/j.mee.2015.04.105. Epub May 5, 2015.

Bedell et al., Vertical light-emitting diode fabrication by controlled spalling. Appl Phys Exp. 2013;6(11):112301(1-4). Epub Oct. 18, 2013.

Bedell et al., Layer transfer by controlled spalling. J Phys D: Appl Phys. 2013;46(15):152002(1-6).

Bedell et al., Kerf-less removal of Si, Ge, and III-V layers by controlled spalling to enable low-cost PV technologies. IEEE J Photovolt. Apr. 2012;2(2):141-7.

Berger et al., Ultrathin epitaxial graphite: 2D electron gas properties and a route toward graphene-based nanoelectronics. J Phys Chem B. 2004;108(52):19912-6. Epub Dec. 3, 2004.

Cheng et al., Epitaxial lift-off process for gallium arsenide substrate reuse and flexible electronics. Nat Commun. 2013;4:1577(1-7). Epub Mar. 12, 2013.

Chung et al., Transferable GaN layers grown on ZnO-coated graphene layers for optoelectronic devices. Science. Oct. 29, 2010;330(6004):655-7. doi: 10.1126/science.1195403.

De Heer et al., Epitaxial graphene. Solid State Commun. 2007;143(1-2):92-100. Epub Apr. 27, 2007.

Diebold et al., Growth and characterization of GaAs on Sapphire (0001) by molecular beam epitaxy. Surf Interf Anal. Feb. 1990;15(2):150-8.

Distler, The real structure of crystals and selective nucleation at surface local long range active centres. J Cryst Growth. 1968;3:175-9.

Distler et al., Polarization structure of interfacial amorphous films. Nature. Jan. 4, 1969;221:52-3.

Distler et al., Oriented crystallization of AgCl on amorphous polyvinyl chloride replicas of NaCl single crystal surfaces. Thin Solid Films. 1970;6:203-11.

Emtsev et al., Towards wafer-size graphene layers by atmospheric pressure graphitization of silicon carbide. Nat Mater. Mar. 2009;8(3):203-7. doi: 10.1038/nmat2382. Epub Feb. 8, 2009.

Freund et al., Thin film materials: Stress, defect formation and surface evolution. Cambridge Univ Press. 2009. 820 pages.

Greaving, Fabrication and characterization of diamond thin films as nanocarbon transistor substrates. Master's Thesis. Vanderbilt University. 48 pages. Aug. 2013.

Henning, Orientation of vacuum condensed overgrowths through amorphous layers. Nature. Sep. 12, 1970;227:1129-31.

Iida et al., Laser lift-off technique for freestanding GaN substrate using an In droplet formed by thermal decomposition of GaInN and its application to light-emitting diodes. Appl Phys Lett. 2014;105:072101(1-4). Epub Aug. 18, 2014.

(56) References Cited

OTHER PUBLICATIONS

Kayes et al., Flexible thin-film tandem solar cells with >30% efficiency. IEEE J Photovolt. Mar. 2014;4(2):729-33.
Kim et al., Engineering of contact resistance between transparent single-walled carbon nanotube films and a-Si:H single junction solar cells by gold nanodots. Adv Mater. Apr. 10, 2012;24(14):1899-902. doi: 10.1002/adma.201104677. Epub Mar. 5, 2012.
Kim et al., 9.4% efficient amorphous silicon solar cell on high aspect-ratio glass microcones. Adv Mater. Jun. 2014;26(24):4082-6. Epub Mar. 20, 2014.
Kim et al., High efficiency $Cu_2ZnSn(S,Se)_4$ solar cells by applying a double $In_2S_3$/CdS emitter. Adv Mater. Nov. 2014;26(44):7427-31. Epub Aug. 25, 2014.
Kim et al., Fabrication of dislocation-free tensile strained Si thin films using controllably oxidized porous Si substrates. Appl Phys Lett. 2006;89(15):152117(1-3). Epub Oct. 12, 2006.
Kim et al., A method for fabricating dislocation-free tensile-strained SiGe films via the oxidation of porous Si substrates. Appl Phys Lett. 2007;91(25):252108(1-3). Epub Dec. 19, 2007.
Kim et al., 10.5% efficient polymer and amorphous silicon hybrid tandem photovoltaic cell. Nat Commun. 2015;6:6391(1-6). doi: 10.1038/ncomms7391. 6 pages. Epub Mar. 4, 2015.
Kim et al., Layer-resolved graphene transfer via engineered strain layers. Science. Nov. 15, 2013;342(6160):833-6.
Kobayashi et al., Layered boron nitride as a release layer for mechanical transfer of GaN-based devices. Nature. Apr. 12, 2012;484:223-7.
Koma et al., Van der Waals epitaxy for highly lattice-mismatched systems. J Cryst Growth. 1999;201-202:236-41.
Koma et al., Fabrication and characterization of heterostructures with subnanometer thickness. Microelectron Eng. Oct. 1984;2(1-3):129-36.
Lee et al., Natural substrate lift-off technique for vertical light-emitting diodes. Appl Phys Exp. 2014;7(4):042103(1-4). Epub Mar. 14, 2014.
Lee et al., Reuse of GaAs substrates for epitaxial lift-off by employing protection layers. J Appl Phys. 2012;111(3):033527(1-6). Epub Feb. 15, 2012.
Lee et al., Wafer-scale growth of single-crystal monolayer graphene on reusable hydrogen-terminated germanium. Science. Apr. 18, 2014;344(6181):286-9.
Lin et al., Direct synthesis of van der Waals solids. ACS Nano. Apr. 22, 2014;8(4):3715-23. doi: 10.1021/nn5003858. Epub Mar. 18, 2014.
Loher et al., Van der Waals epitaxy of three-dimensional CdS on the two-dimensional layered substrate $MoTe_2$(0001). Appl Phys Lett. Aug. 1, 1994;65(5):555-7.
Nakamura et al., GaN growth using GaN buffer layer. Jap J Appl Phys. Oct. 1991;30(10A):L 1705-7.
Schlar et al., Molecular beam epitaxy growth of thin films of $SnS_2$ and $SnSe_2$ on cleaved mica and the basal planes of single-crystal layered semiconductors: Reflection high-energy electron diffraction, low-energy electron diffraction, photoemission, and scanning tunneling microscopy/atomic force microscopy characterization. J Vac Sci Technol A. May/Jun. 1995;13(3):1761-7.
Shahrjerdi et al., Ultralight high-efficiency flexible InGaP/(In)GaAs tandem solar cells on plastic. Adv Energy Mater. May 2013;3(5):566-71.
Shahrjerdi et al., Extremely flexible nanoscale ultrathin body silicon integrated circuits on plastic. Nano Lett. 2013;13:315-20. Epub Dec. 18, 2012.
Suo et al., Steady-state cracking in brittle substrates beneath adherent films. Int J Solid Structures. 1989;25(11):1337-53.
Tanaka et al., Anisotropic layer-by-layer growth of graphene on vicinal SiC(0001) surfaces. Phys Rev B. Jan. 2010;81(4):041406R(1-4).
Thouless et al., The edge cracking and spalling of brittle plates. Acta Metall. 1987;35(6):1333-41.
Ueda et al., Separation of thin GaN from sapphire by laser lift-off technique. Jap J Appl Phys. 2011;50(4R):041001(1-6). Epub Apr. 20, 2011.
Ueno et al., Epitaxial growth of transition metal dichalcogenides on cleaved faces of mica. J Vac Sci Technol A. Jan./Feb. 1990;8(1):68-72.
Vishwanath et al., Controllable growth of layered selenide and telluride heterostructures and superlattices using molecular beam epitaxy. J Mater Res. Apr. 14, 2016;31(7):900-10.
Wang et al., Direct growth of graphene film on germanium substrate. Sci Rep. 2013;3:2465(1-6). doi: 10.1038/srep02465. Epub Aug. 19, 2013.
Yablonovitch et al., Extreme selectivity in the lift-off of epitaxial GaAs films. Appl Phys Lett. Dec. 28, 1987;51(26):2222-4.
Extended European Search Report dated Aug. 23, 2019 for Application No. EP 16845018.7.
International Search Report and Written Opinion dated Aug. 28, 2019 for Application No. PCT/US2019/038461.
Kong et al., Polarity governs atomic interaction through two-dimensional materials. Nat Mater. Nov. 2018;17:999-1005.
Chun et al., Vertically Stacked Color Tunable Light-Emitting Diodes Fabricated Using Wafer Bonding and Transfer Printing. ACS Appl Mater Interfaces. Nov. 3, 2014;6:19482-7. doi: dx.doi.org/10.1021/am505415q.

\* cited by examiner

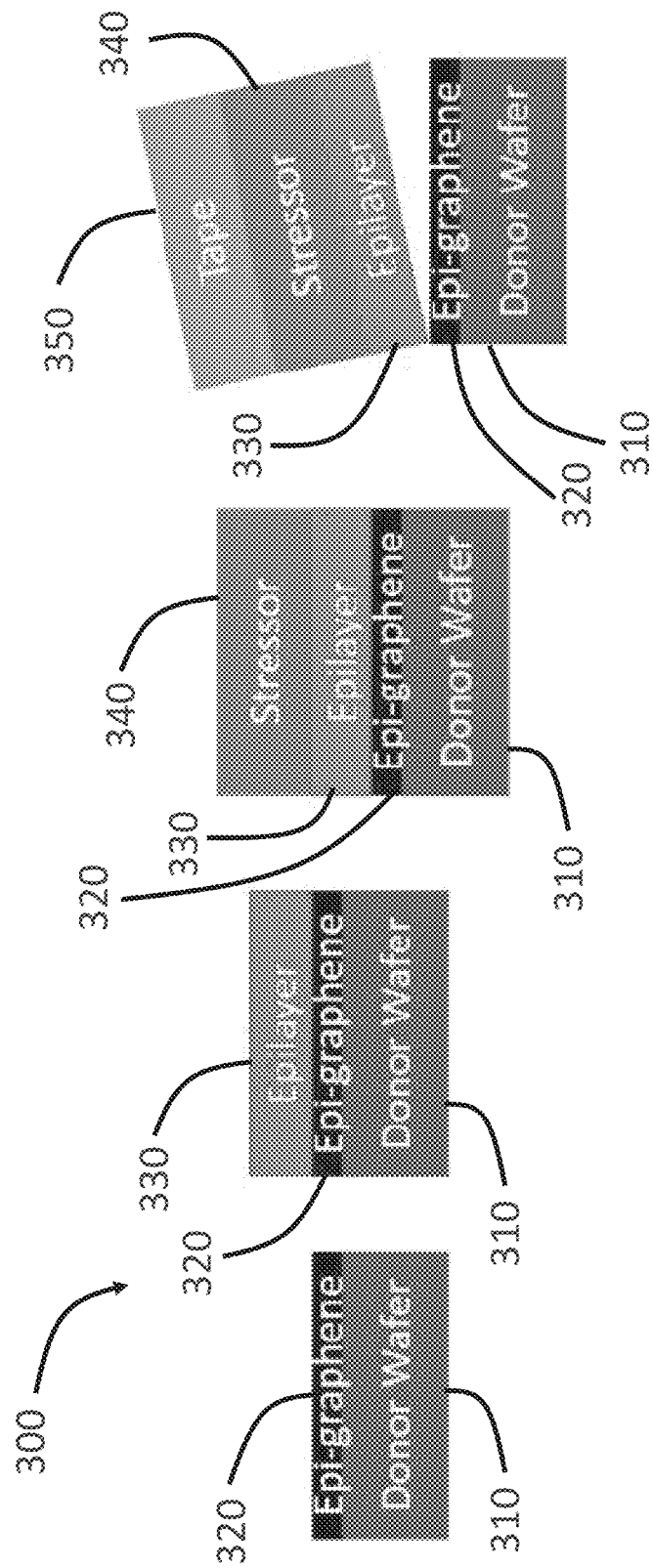

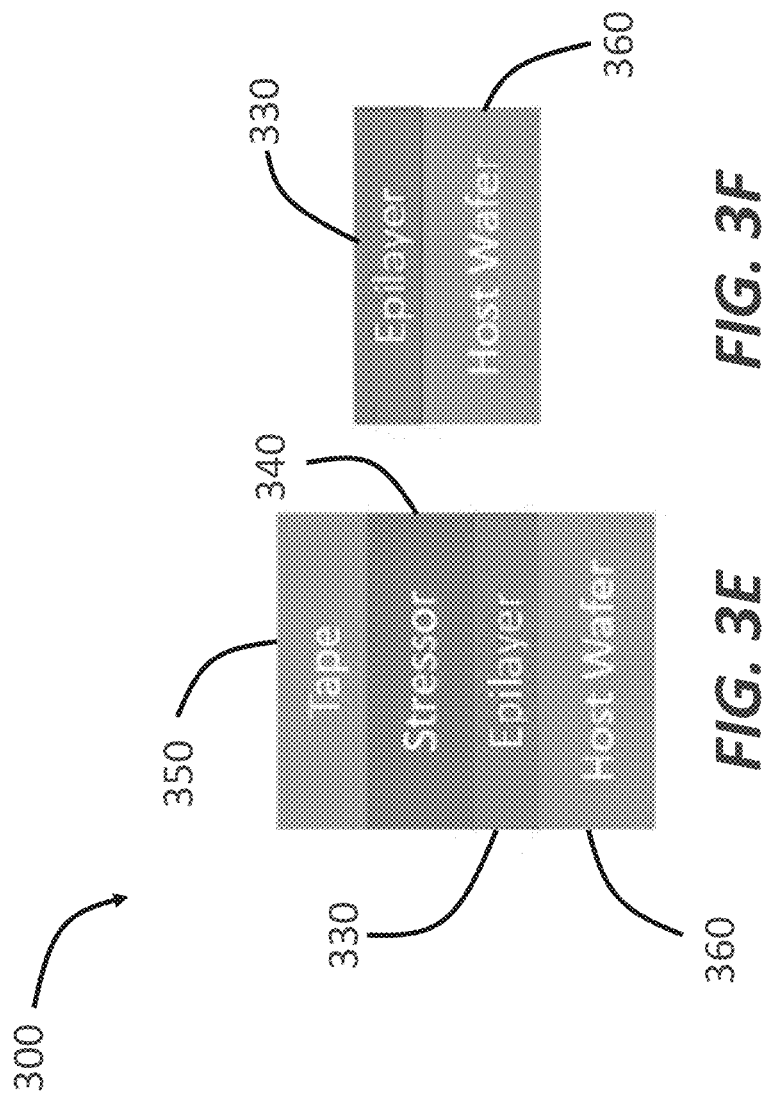

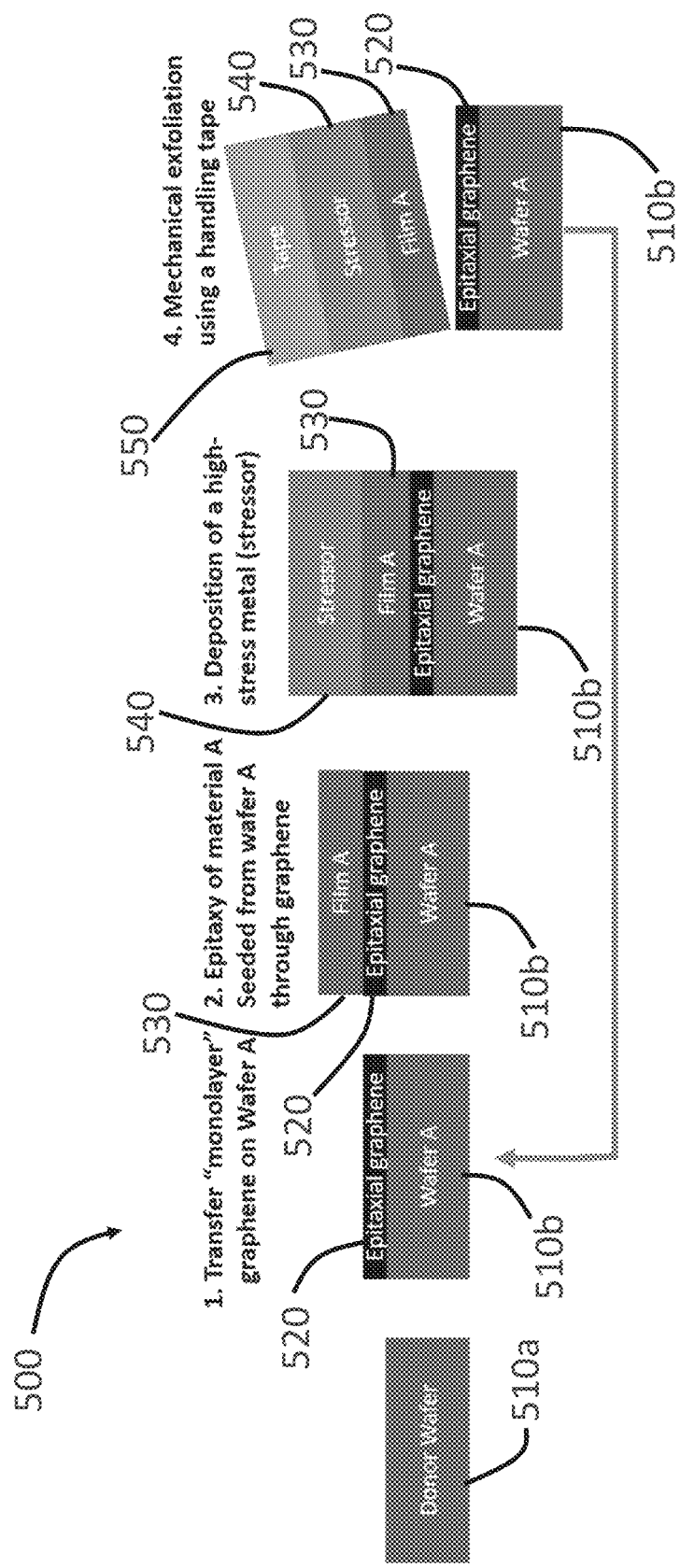

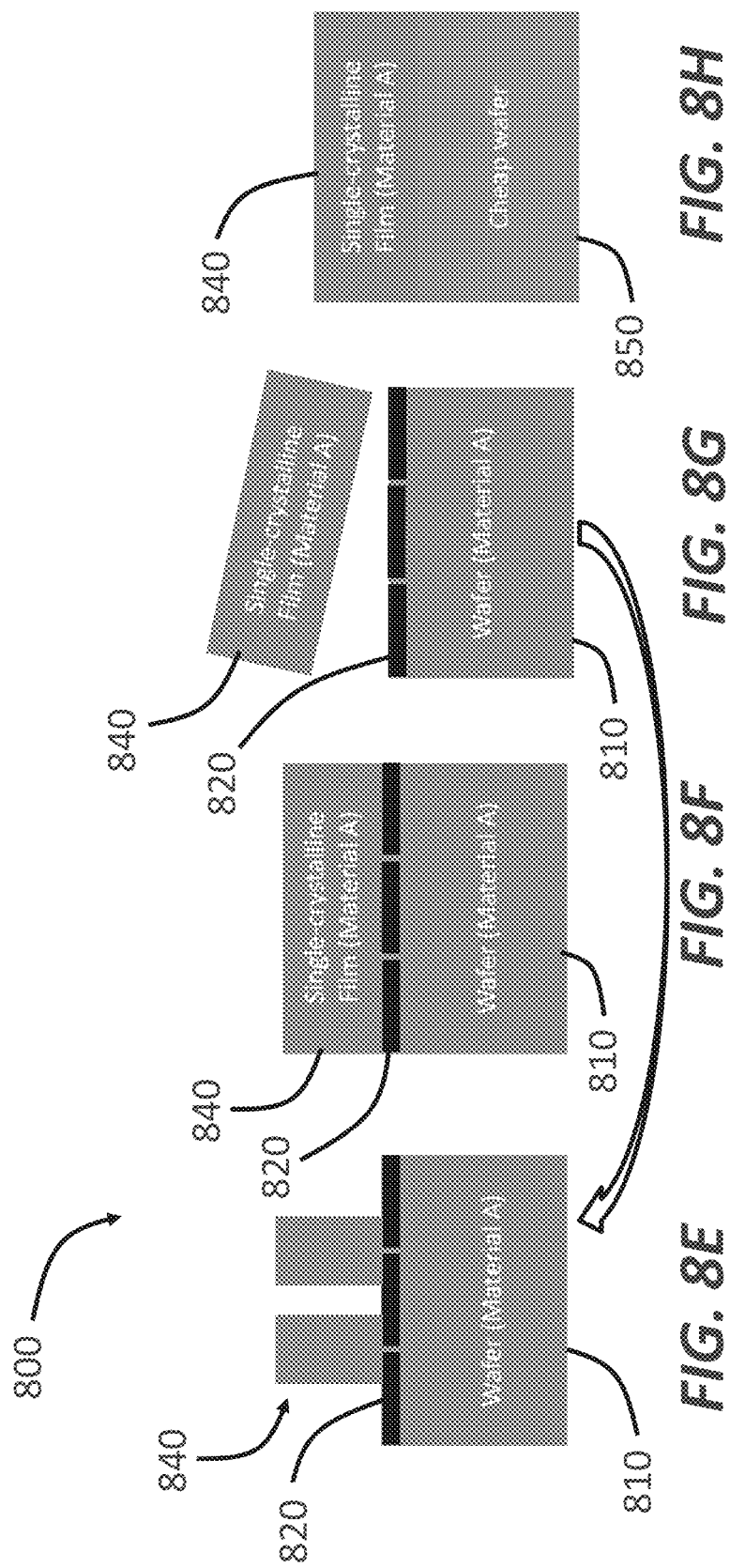

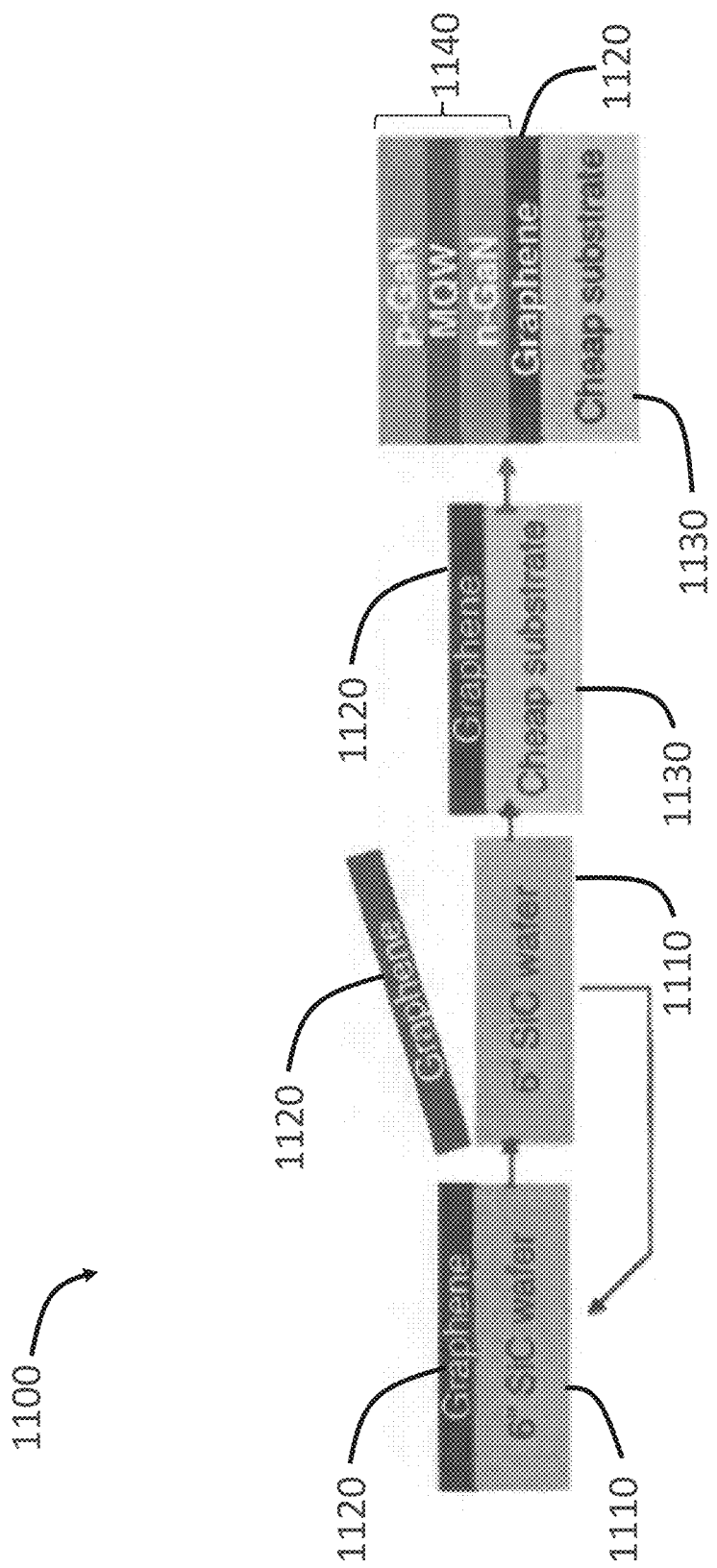

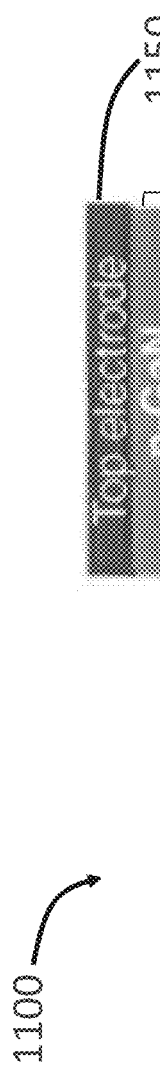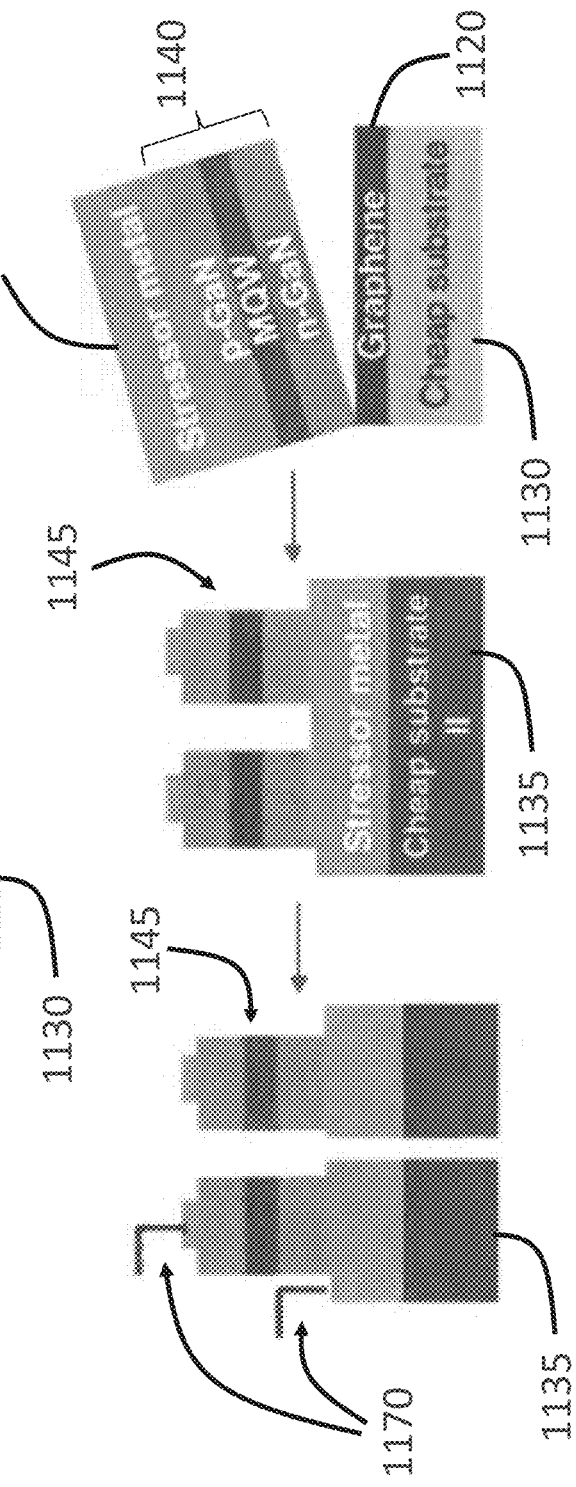
FIG. 11E  FIG. 11F  FIG. 11G  FIG. 11H

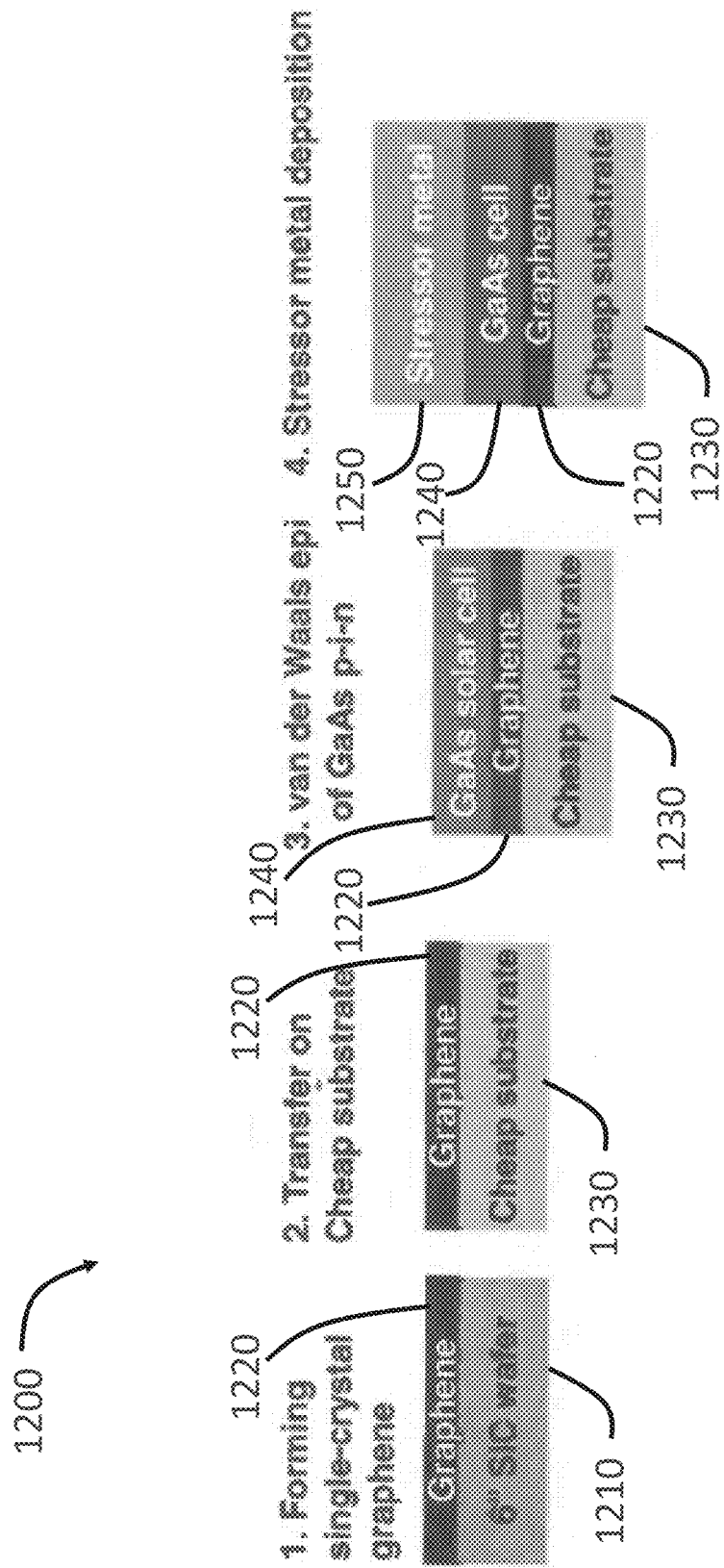

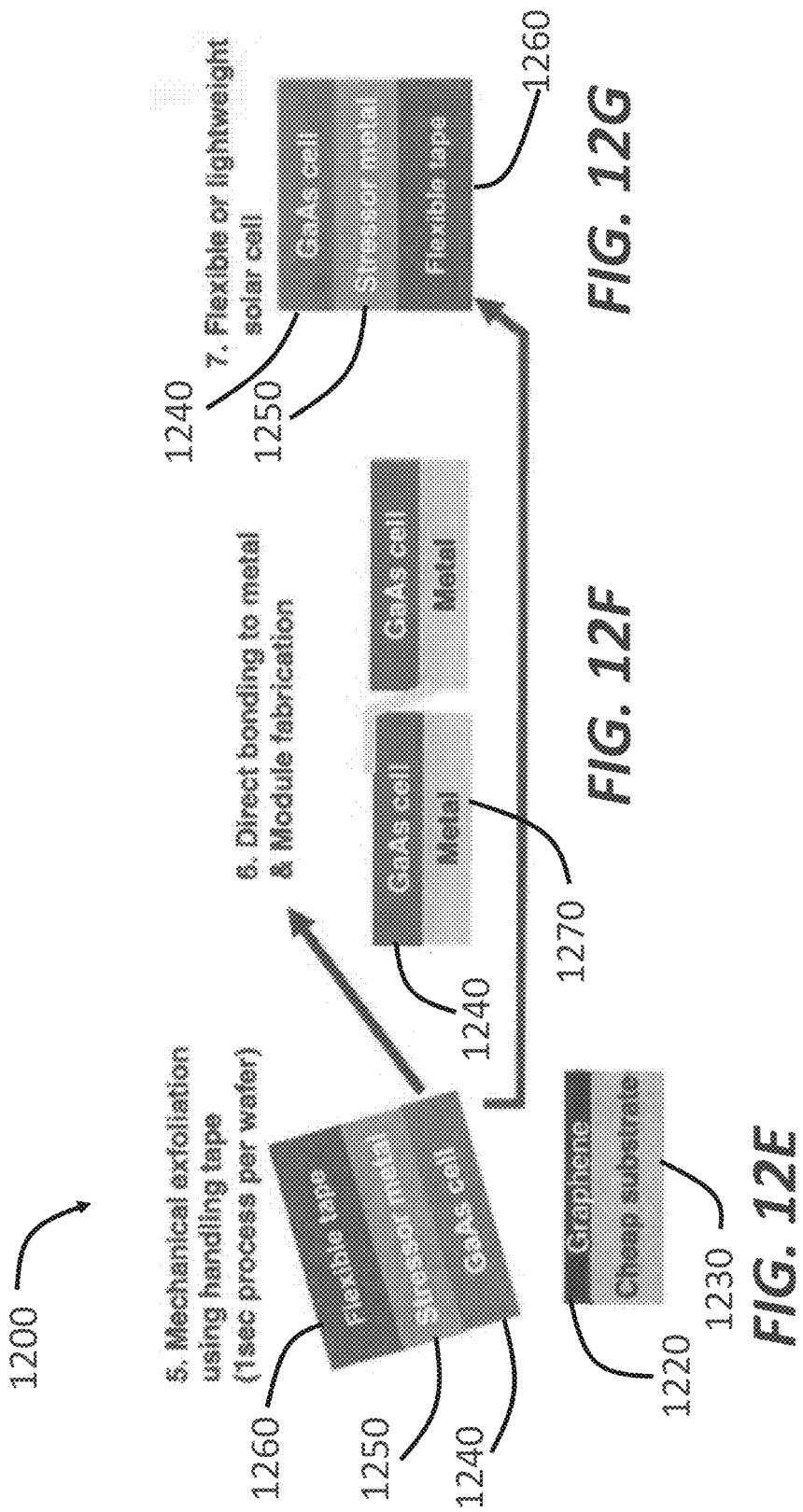

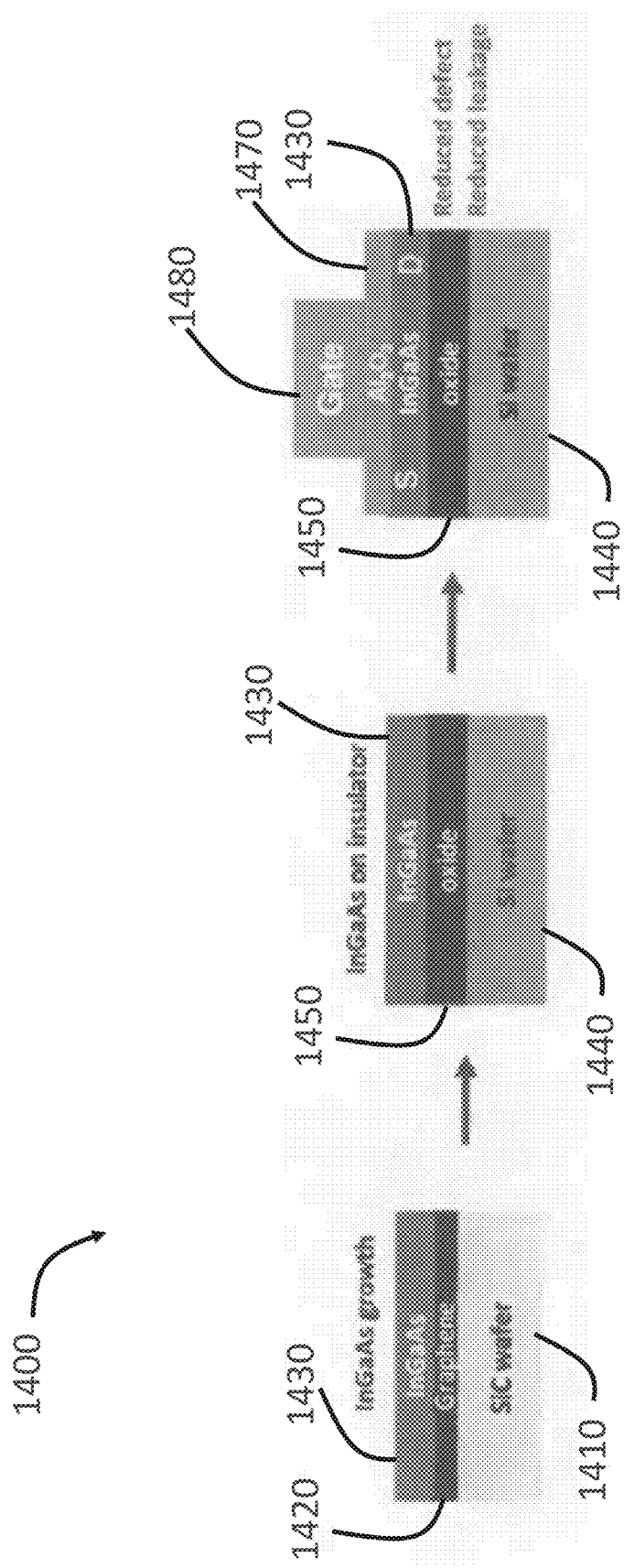

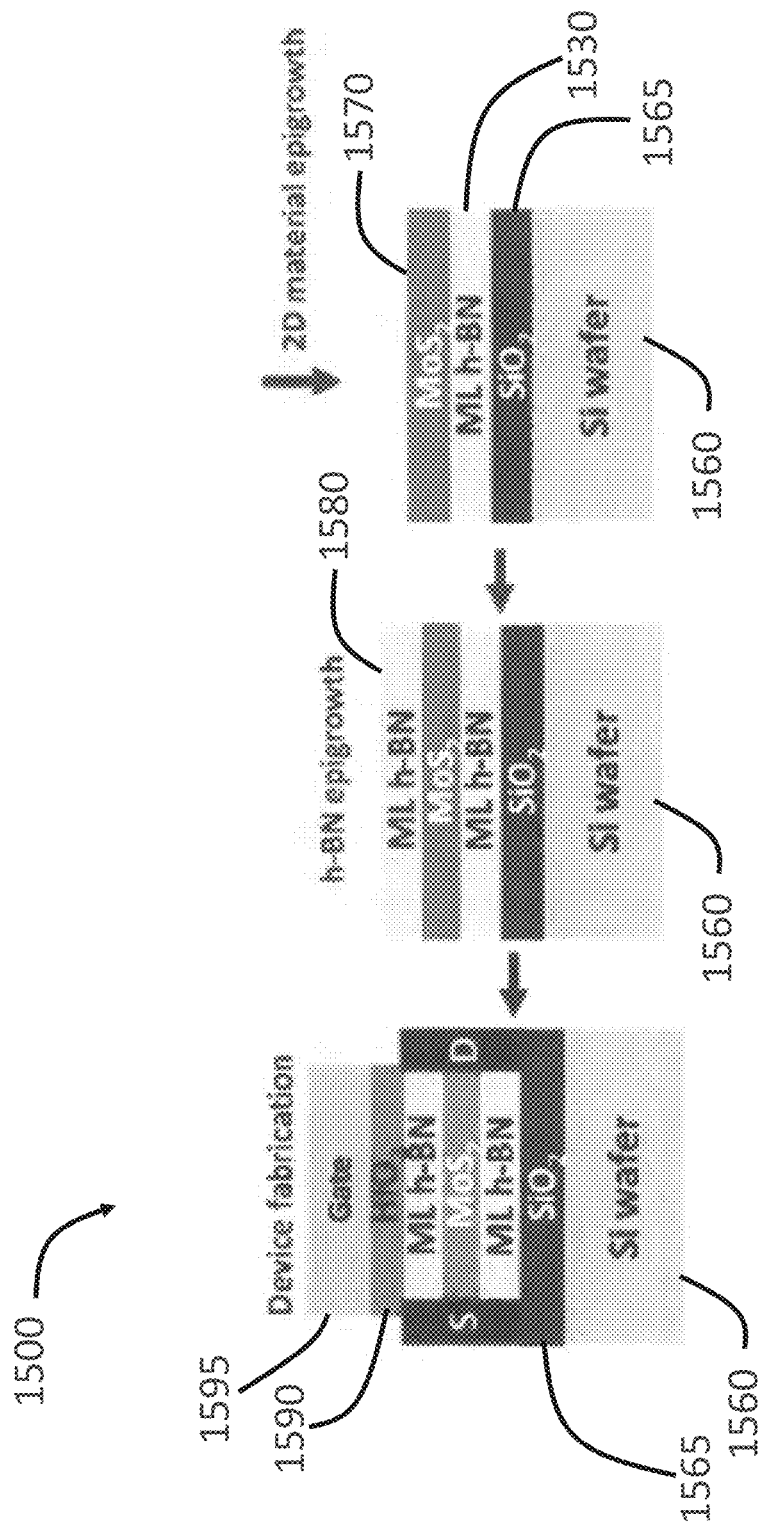

SYSTEMS AND METHODS FOR GRAPHENE BASED LAYER TRANSFER

CROSS-REFERENCES TO RELATED APPLICATIONS

This application is a bypass continuation of International Application No. PCT/US2016/050701, filed Sep. 8, 2016, and entitled "Systems and Methods for Graphene Based Layer Transfer," which in turn claims the priority benefit under 35 U.S.C. § 119(e) of: U.S. Application No. 62/361,717, filed Jul. 13, 2016, and entitled "COST-EFFECTIVE LAYER-TRANSFER TECHNIQUE FOR ALL ELECTRONIC/PHOTONIC/MAGNETIC MATERIALS"; U.S. Application No. 62/335,784, filed May 13, 2016, and entitled "DISLOCATION-FREE III-V INTEGRATION ON A SI WAFER"; and U.S. Application No. 62/215,223, filed Sep. 8, 2015, and entitled "GRAPHENE-BASED LAYER TRANSFER PROCESS FOR ADVANCED COST-EFFICIENT ELECTRONICS/PHOTONICS." Each of these applications is hereby incorporated herein by reference in its entirety.

BACKGROUND

In advanced electronic and photonic technologies, devices are usually fabricated from functional semiconductors, such as III-N semiconductors, III-V semiconductors, II-VI semiconductors, and Ge. The lattice constants of these functional semiconductors typically do not match the lattice constants of silicon substrates. As understood in the art, lattice constant mismatch between a substrate and an epitaxial layer on the substrate can introduce strain into the epitaxial layer, thereby preventing epitaxial growth of thicker layers without defects. Therefore, non-silicon substrates are usually employed as seeds for epitaxial growth of most functional semiconductors. However, non-Si substrates with lattice constants matching those of functional materials can be costly and therefore limit the development of non-Si electronic/photonic devices.

One method to address the high cost of non-silicon substrates is the "layer-transfer" technique, in which functional device layers are grown on lattice-matched substrates and then removed and transferred to other substrates. The remaining lattice-matched substrates can then be reused to fabricate another device layer, thereby reducing the cost. To significantly reduce manufacturing costs, it can be desirable for a layer-transfer method to have the following properties: 1) substrate reusability; 2) a minimal substrate refurbishment step after the layer release; 3) a fast release rate; and 4) precise control of release thickness.

Conventional methods to remove and transfer a device layer from a lattice-matched substrate include chemical lift-off (also referred to as epitaxial lift-off or ELO), optical lift-off (also referred to as laser lift-off or LLO, and mechanical lift-off (also referred to as controlled spalling). Unfortunately, none of these methods has the four desired properties at the same time.

The chemical lift-off technique can be used for lifting off devices layers made of III-V semiconductors from GaAs wafers. A sacrificial layer of AlAs is usually epitaxially inserted between the device layer and the substrate. Chemical lift-off technique selectively etches the sacrificial layer in a wet-chemical solution to release the device layers.

Despite its continuous development over the last three decades, chemical lift-off still has several disadvantages. For example, the release rate is slow owing to slow penetration of chemical etchant through the sacrificial layer (e.g., typically a few days to release a single 8-inch wafer). Second, etching residues tend to become surface contamination after release. Third, chemical lift-off has limited reusability owing to the chemical mechanical planarization (CMP) performed after release to recover the roughened substrate surface into an epi-ready surface. Fourth, it can be challenging to handle released epilayers in the chemical solution.

The optical lift-off technique usually uses a high-power laser to irradiate the back of the lattice-matched substrate (e.g., a transparent sapphire or SiC substrate) and selectively heat the device-substrate interface, causing decomposition of the interface and release of the device layer (e.g., III-N film). This technique can reduce the cost of manufacturing III-N-based light emitting diodes (LEDs) and address the problem of heat accumulation from the device by transferring released III-Ns to a substrate that has high thermal conductivity.

However, optical lift-off has its own limitations. First, because the molten III-N/substrate interface can make the substrate rough, a reconditioning step is usually carried out before reuse, thereby reducing the reusability to less than five times. Second, local pressurization at the interface caused by high-power thermal irradiation can induce cracks or dislocations. Third, the laser scanning speed can be too slow to permit high-throughput.

Controlled spalling can have a higher throughput than optical lift-off. In this technique, high-stress films (also referred to as "stressors") are deposited on the epitaxial film, inducing fracture below the epilayers and resulting in the separation of active materials from the substrate. When sufficient tensile stress is applied to the interface, a $K_{II}$ shear mode can initiate a crack and a $K_I$ opening mode can allow the propagation of the crack parallel to the interface between the epilayer and the substrate. By controlling the internal stress and thickness of the stressor, strain energy sufficient to reach the critical $K_I$ can be provided, leading to fracture of the film/substrate interface. Because the exfoliation occurs via crack propagation, the spalling process can cause rapid release of films.

However, controlled spalling is not mature enough to be used for commercial manufacturing for at least the following reasons. First, because crack propagation generally occurs through cleavage planes that are not always aligned normal to the surface, the surface may need polishing for reuse. Second, a thick stressor is usually used to provide enough energy to separate strong covalent bonds, particularly when working with high Young's modulus materials like III-N semiconductors. Third, the internal stress of the stressor may only be controlled in a narrow range, which constrains the achievable thickness of the resulting spalled film. For example, because the maximum internal stress in a typical Ni stressor is about 1 GPa, the critical Ni thickness under 1 GPa tensile stress to initiate spalling of a GaAs film is about 1.5 μm, which can induce spalling of the GaAs film itself if the GaAs is about 10 μm thick. Therefore, when using a Ni stressor it can be challenging to make a GaAs film less than 10 μm thick, but typically most devices use films that are much thinner.

SUMMARY

Embodiments of the present invention include apparatus, systems, and methods for nanofabrication. In one example, a method of manufacturing a semiconductor device includes forming a graphene layer on a first substrate and transferring the graphene layer from the first substrate to a second substrate. The method also includes forming a single-crystalline film on the graphene layer.

In another example, a method of semiconductor processing includes forming a graphene monolayer on a silicon carbide substrate and transferring the graphene monolayer from the silicon carbide substrate to a semiconductor substrate. The method also includes forming a plurality of holes in the graphene monolayer and forming a first single-crystalline layer of semiconductor material on the graphene monolayer. The semiconductor substrate acts as a seed for the first single-crystalline layer of semiconductor material. The method also includes removing the first single-crystalline layer of semiconductor material from the graphene monolayer and forming a second single-crystalline layer of semiconductor material on the graphene monolayer. The semiconductor substrate acts as a seed for the second single-crystalline layer of semiconductor material. The method further includes removing the second single-crystalline layer of semiconductor material from the graphene monolayer.

In yet another example, a method of semiconductor processing includes forming a graphene layer on a first substrate and transferring the graphene layer from the first substrate to a second substrate. The method also includes depositing a semiconductor layer on the graphene layer and depositing a stressor layer on the semiconductor layer. The stressor layer causes propagation of a crack between the semiconductor layer and the graphene layer. The method further includes disposing a flexible tape on the stressor layer and pulling the semiconductor layer and the stressor layer off the graphene layer with the flexible tape.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 3A-3F illustrate a method of graphene-based layer fabrication and transfer using a stressor layer and tape.

FIGS. 5A-5E illustrate a method of graphene-based layer transfer using a thin graphene layer.

FIGS. 8A-8H illustrate a method of graphene-based layer fabrication and transfer using porous graphene, corresponding to the configuration shown in FIG. 7C.

FIGS. 11A-11H illustrate a method of fabricating light emitting diodes using a graphene-based layer fabrication and transfer technique.

FIGS. 12A-12G illustrate a method of fabricating GaAs solar cells using a graphene-based layer fabrication and transfer technique.

FIGS. 14A-14C illustrate a method of fabrication transistors using a graphene-based layer fabrication and transfer technique.

FIGS. 15A-15F illustrate a method of hetero-integration using a graphene-based layer fabrication and transfer technique.

DETAILED DESCRIPTION

Graphene-Based Layer Growth

Figure 1A:
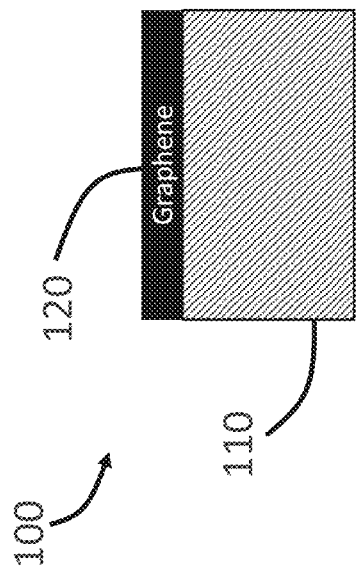
FIGS. 1A-1D illustrate a method of fabricating a semiconductor device using a graphene-based layer transfer process.

As described above, it can be desirable for a layer-transfer process to have substrate reusability, minimal needs for post-release treatment, a fast release rate, precise control of release interfaces, and universality for a wide range of device materials. Conventional layer-transfer processes may exhibit some of the desired properties. For example, layer release is much faster for mechanical lift-off than for chemical or optical lift-off, whereas the release location can be better controlled in chemical and optical lift-off. However, conventional layer-transfer methods suffer from rough surface formation after layer release, thereby limiting substrate reusability. In fact, the process cost to refurbish the substrate surface in conventional layer-transfer methods typically exceeds the substrate cost, so practical applications in manufacturing can be challenging. In addition, each conventional method usually works for a limited number of specific materials (e.g., chemical lift-off for III-V materials, whose lattice is close to that of GaAs, and optical lift-off for materials that can be grown on transparent substrates). Therefore, it is also challenging to make universal use of these methods.

To address the shortcomings in conventional layer-transfer methods, systems and methods described herein employ a graphene-based layer transfer (GBLT) approach to fabricate devices. In this approach, functional devices are fabricated on a graphene layer, which in turn is disposed on a substrate that is lattice-matched to the functional device layers. In one example, the graphene layer is deposited directly on the lattice-matched substrate. In another example, the graphene layer is transferred to the lattice-matched substrate from another substrate. The fabricated functional devices can then be removed from the lattice-matched substrate via, for example, a stressor attached to the functional devices.

In this GBLT approach, graphene serves as a reusable and universal platform for growing device layers and also serves a release layer that allows fast, precise, and repeatable release at the graphene surface. Compared to conventional methods, GBLT has several advantages. First, because graphene is a crystalline film, it is a suitable substrate for growing epitaxial over-layers. Second, graphene's weak interaction with other materials can substantially relax the lattice mismatching rule for epitaxial growth, potentially permitting the growth of most semiconducting films with low defect densities. Third, the epilayer (e.g., functional devices) grown on a graphene substrate can be easily and precisely released from the substrate owing to graphene's weak van der Waals interactions, which permits rapid mechanical release of epilayers without post-release reconditioning of the released surface. Fourth, graphene's mechanical robustness can maximize its reusability for multiple growth/release cycles.

Implementation of GBLT for general material systems can have a significant impact on both the scientific community and industry because GBLT has the potential to fabricate devices without the expensive millimeter-thick, single-crystalline wafers used in current semiconductor processing. Moreover, the entire functional device can be transferred from the graphene layer, for additional flexible functions.

Figure 1B:
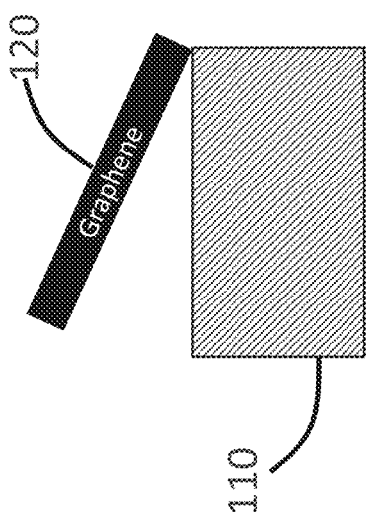
Figure 1C:
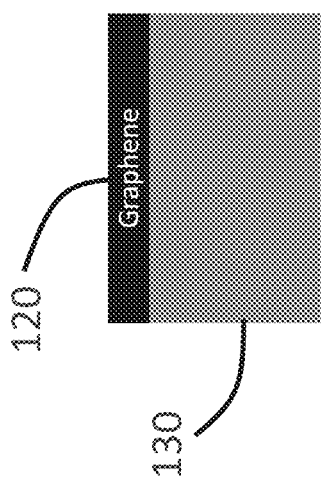
Figure 1D:
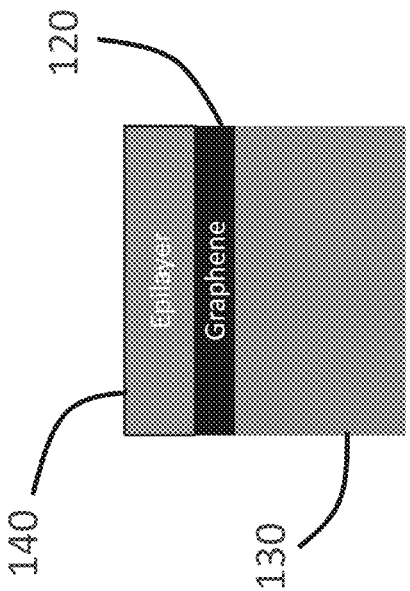

FIGS. 1A-1D illustrate a method 100 of fabricating a device layer using graphene as a platform. As shown in FIG. 1A, a graphene layer 120 is fabricated on a first substrate 110, such as a Si substrate, SiC substrate, or copper foil. The fabricated graphene layer 120 is then removed from the first substrate 110 as shown in FIG. 1B. The removed graphene layer 120 is then disposed on a second substrate 130, such as a Ge substrate, as shown in FIG. 1C. FIG. 1D shows that an epilayer 140 (e.g., a single crystalline film to have high electrical and optical device performance) is then fabricated on the graphene layer 120. The epilayer 140 is also referred to as a device layer or a functional layer in this application.

The graphene layer 120 can be fabricated on the first substrate 110 via various methods In one example, the graphene layer 120 can include an epitaxial graphene with a single-crystalline orientation and the substrate 110 can include a (0001) 4H—SiC wafer with a silicon surface. The fabrication of the graphene layer 120 can include multistep annealing steps. A first annealing step can be performed in $H_2$ gas for surface etching and vicinalization, and a second annealing step can be performed in Ar for graphitization at high temperature (e.g., about 1,575° C.)

In another example, the graphene layer 120 can be grown on the first substrate 110 via a chemical vapor deposition (CVD) process. The substrate 110 can include a nickel substrate or a copper substrate. Alternatively, the substrate 100 can include an insulating substrate of $SiO_2$, $HfO_2$, $Al_2O_3$, $Si_3N_4$, and practically any other high temperature compatible planar material by CVD.

In yet another example, the first substrate 110 can be any substrate that can hold the graphene layer 120 and the fabrication can include a mechanical exfoliation process. In this example, the first substrate 110 can function as a temporary holder for the graphene layer 120.

Various methods can also be used to transfer the graphene layer 120 from the first substrate 110 to the second substrate. In one example, a carrier film can be attached to the graphene layer 120. The carrier film can include a thick film of Poly(methyl methacrylate) (PMMA) or a thermal release tape and the attachment can be achieved via a spin-coating process. After the combination of the carrier film and the graphene layer 120 is disposed on the second substrate 130, the carrier film can be dissolved (e.g., in acetone) for further fabrication of the epilayer 140 on the graphene layer 120.

In another example, a stamp layer including an elastomeric material such as polydimethylsiloxane (PDMS) can be attached to the graphene layer 120 and the first substrate can be etched away, leaving the combination of the stamp layer and the graphene layer 120. After the stamp layer and the graphene layer 120 are placed on the second substrate 130, the stamp layer can be removed by mechanical detachment, producing a clean surface of the graphene layer 120 for further processing.

In yet another example, a self-release transfer method can be used to transfer the graphene layer 120 to the second substrate 130. In this method, a self-release layer is first spun-cast over the graphene layer 120. An elastomeric stamp is then placed in conformal contact with the self-release layer. The first substrate 110 can be etched away to leave the combination of the stamp layer, the self-release layer, and the graphene layer. After this combination is placed on the second substrate 130, the stamp layer can be removed mechanically and the self-release layer can be dissolved under mild conditions in a suitable solvent. The release layer can include polystyrene (PS), poly(isobutylene) (PIB) and Teflon AF (poly[4,5-difluoro-2,2-bis(trifluoromethyl)-1,3-dioxole-co-tetrafluoroethylene]).

The epilayer 140 can include a III-V semiconductor, Si, Ge, III-N semiconductor, SiC, SiGe, and II-VI semiconductors, among others. In one example, the lattice of the second substrate 130 is matched to the epilayer 140, in which case the second substrate 130 functions as the seed for the growth of the epilayer 140 if the graphene layer 120 is porous or thin enough (e.g., if the graphene layer 120 is one layer thick). Sandwiching the graphene layer 120 between the second substrate 130 and the epilayer 140 can facilitate quick and damage-free release and transfer of the epilayer 140.

In another example, the graphene layer 120 can be thick enough (e.g., several layers thick) to function as a seed to grow the epilayer 140, in which case the epilayer 140 can be latticed-matched to the graphene layer 120. This example also allows repeated use of the second substrate 130. In yet another example, the second substrate 130 together with the graphene layer 120 can function as the seed to grow the epilayer 140.

Using graphene as the seed to fabricate the epilayer 140 can also increase the tolerance over mismatch of lattice constant between the epilayer material and graphene. Without being bound by any particular theory or mode of operation, surfaces of two-dimensional (2D) materials (e.g., graphene) or quasi-2D layered crystals typically have no dangling bonds and interact with material above them via weak van der Waals like forces. Due to the weak interaction, an epilayer can grow from the beginning with its own lattice constant forming an interface with a small amount of defects. This kind of growth can be referred to as Van Der Waals Epitaxy (VDWE). The lattice matching condition can be drastically relaxed for VDWE, allowing a large variety of different heterostructures even for highly lattice mismatched systems.

In practice, the lattice mismatch can be about 0% to about 70% (e.g., about 0%, about 10%, about 20%, about 30%, about 40%, about 50%, about 60%, and about 70%, including any values and sub ranges in between).

In one example, the epilayer 140 includes a 2D material system. In another example, the epilayer 140 includes a 3D material system. The flexibility to fabricate both 2D and 3D material systems allows fabrication of a wide range of optical, opto-electronic, and photonic devices known in the art.

Figure 2:
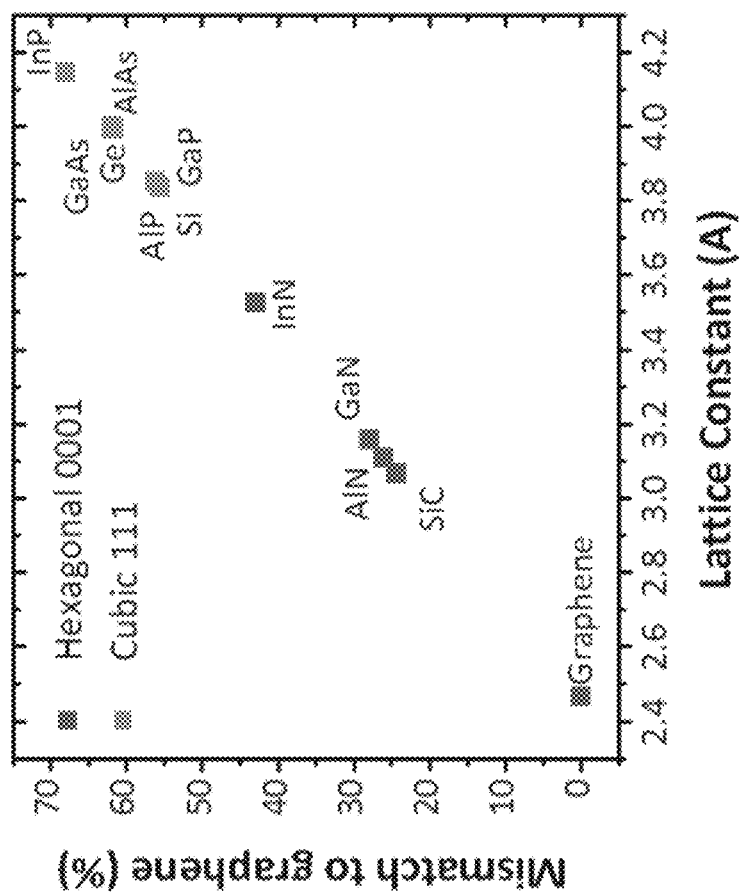
FIG. 2 is a graph showing materials that can be used to fabricate devices using the graphene-based technique illustrated in FIGS. 1A-1D, as well as the lattice constant and lattice mismatch of these materials.

FIG. 2 is a graph showing materials that can be deposited on the graphene layer 120 to form the epilayer 140. FIG. 2 also shows the lattice constants of these materials and the mismatch of of these lattice constants with respect to graphene. These materials include SiC, AlN, GaN, InN, GaP, AlP, Silicon, AlAs, Ge, GaAs, and InP. These materials listed on FIG. 2 are for illustrative purposes only. In practice, other materials with similar lattice mismatches with respect to graphene can also be used to form the epilayer 140.

The fabrication of the epilayer 140 can be carried out using semiconductor fabrication technique known in the art. For example, low-pressure Metal-Organic Chemical Vapor Deposition (MOCVD) can be used to grow the epilayer 140 (e.g., a GaN film) on the graphene layer 120, which in turn is disposed on the second substrate 130 (e.g., a SiC substrate). In this example, the graphene layer 120 and the second substrate 130 can be baked (e.g., under $H_2$ for >15 min at >1,100° C.) to clean the surface. Then the deposition of the epilayer 140 including GaN can be performed at, for example, 200 mbar. Trimethylgallium, ammonia, and hydrogen can be used as the Ga source, nitrogen source, and carrier gas, respectively. A modified two-step growth can be employed to obtain flat GaN epitaxial films on the epitaxial graphene 120. The first step can be carried out at a growth temperature of 1,100° C. for few minutes where guided nucleation at terrace edges can be promoted. The second growth step can be carried out at an elevated temperature of 1,250° C. to promote the lateral growth. Vertical GaN growth rate in this case can be around 20 nm per min.

Graphene-Based Layer Transfer

FIGS. 3A-3F illustrate a method 300 of graphene-based layer transfer. FIG. 3A shows that a graphene layer 320 is formed or disposed on a donor wafer 310, which may be a single-crystalline wafer. For example, the graphene layer 320 can include epitaxial graphene grown on the donor wafer 310 as known in the art. Alternatively, the graphene layer 320 can be exfoliated and transferred to the donor wafer 310 from another wafer (not shown). In yet another example, any of the graphene transfer techniques described above with reference with FIGS. 1A-1D can be used here to prepare the graphene layer 320 disposed on the donor wafer 320.

FIG. 3B shows that an epilayer 330 is epitaxially grown on the graphene layer 320. The epilayer 330 can include an electronic layer, a photonic layer, or any other functional device layer. Methods to fabricate the epilayer 330 can include any methods and techniques described above with respect to FIGS. 1A-1D.

FIG. 3C shows that a stressor 340 is disposed on the epilayer 330. For example, the stressor 330 can include a high-stress metal film such as a Ni film. In this example, the Ni stressor can be deposited in an evaporator at a vacuum level of $1\times10^{-5}$ Torr.

FIG. 3D shows that a tape layer 350 is disposed on the stressor 340 for handling the stressor 340. Using the tape 350 and the stressor 340 can mechanically exfoliate the epilayer 330 from the graphene layer 320 at a fast release rate by applying high strain energy to the interface between the epilayer 330 and the graphene layer 320. The release rate can be fast at least due to the weak van der Waals bonding between graphene and other materials such as the epilayer 330.

In FIG. 3E, the released epilayer 330, together with the stressor 340 and the tape layer 350 are disposed on a host wafer 360. In FIG. 3F, the tape 340 and the stressor 340 are removed, leaving the epilayer 330 for further processing such as forming more sophisticated devices or depositing additional materials on the epilayer 330. In one example, the tape layer 350 and the stressor 340 can be etched away by a $FeCl_3$-based solution.

In the method 300, after the release of the epilayer 330 shown in FIG. 3D, the remaining donor wafer 310 and the graphene layer 320 can be reused for next cycle of epilayer fabrication. Alternatively, the graphene layer 320 can also be released. In this case, a new graphene layer can be disposed on the donor wafer 310 before next cycle of epilayer fabrication. In either case, the graphene layer 320 protects the donor wafer 310 from damage, thereby allowing multiple uses and reducing cost.

In contrast, conventional processes usually include chemical-mechanical planarization (CMP) after release to recondition the wafer surface. CMP can consume relatively thick materials, and repeated CMPs increase the chance of breaking a wafer. GBLT can increase or maximize reusability because it creates an atomically smooth release surface. In GBLT, layer release can occur precisely at the interface between the epilayer 330 and the graphene layer 320 because graphene's weak van der Waals force does not permit strong bonding to adjacent materials. This allows the graphene layer 320 to be reused for multiple growth/exfoliation cycles without the need for a polishing step and without damaging the graphene, due to its mechanical robustness. In addition, GBLT can ensure a fast release rate and universal application for different materials. Because the epilayer 330 is mechanically released from the weak graphene surface, the layer release rate in GBLT can be high. Whereas conventional layer-transfer methods are limited to specific materials, GBLT can be universally applied because VDWE can overcome extremely high lattice mismatch and most semiconductor films can be epitaxially grown on graphene.

Furthermore, by having highly strained freestanding epilayer 330 after release as shown in FIG. 3D, the devices made of the epilayer 330 can have higher electron or hole mobility. AN optoelectronic device made of the epilayer 330 can also have an enhanced optical response.

For mechanical release of the epilayer 330 from the graphene layer 320, it can be desirable for the material of the stressor 340 to provide enough strain energy to the epilayer/graphene interfaces to promote damage-free exfoliation/transfer. One concern for the mechanical release process can be the bending of epilayer 330 during exfoliation and self-exfoliation during deposition of the stressor 340. If the radius of curvature is reduced during exfoliation, strain energy can increase in the epilayer 330. When the strain energy reaches a critical point, cracks can form. Also, if strain energy in the stressor exceeds the epilayer/graphene interface energy, the epilayer 330 may be delaminated during stressor deposition. To address this concern, the transfer of epilayers on graphene can be performed by a feedback loop control.

Effects of Substrate Field on the Epilayer

In the methods illustrated in FIGS. 1A-1D and FIGS. 3A-3F, device layers are fabricated on a graphene layer. Since graphene typically is on the order of one atom thick (e.g., on the order of 3 Å), any covalently-bonded substrate surface immediately below the graphene may affect the epitaxial growth of the device layer by, for example, altering the crystalline orientation of the device layer. Therefore, it can be beneficial to understand the effect of the underlying substrate on the growth of the device layer so as to, for example, reduce defect density on the device layer as well as to control the properties such as crystalline orientation of the device layer.

Figures 4A, 4B:
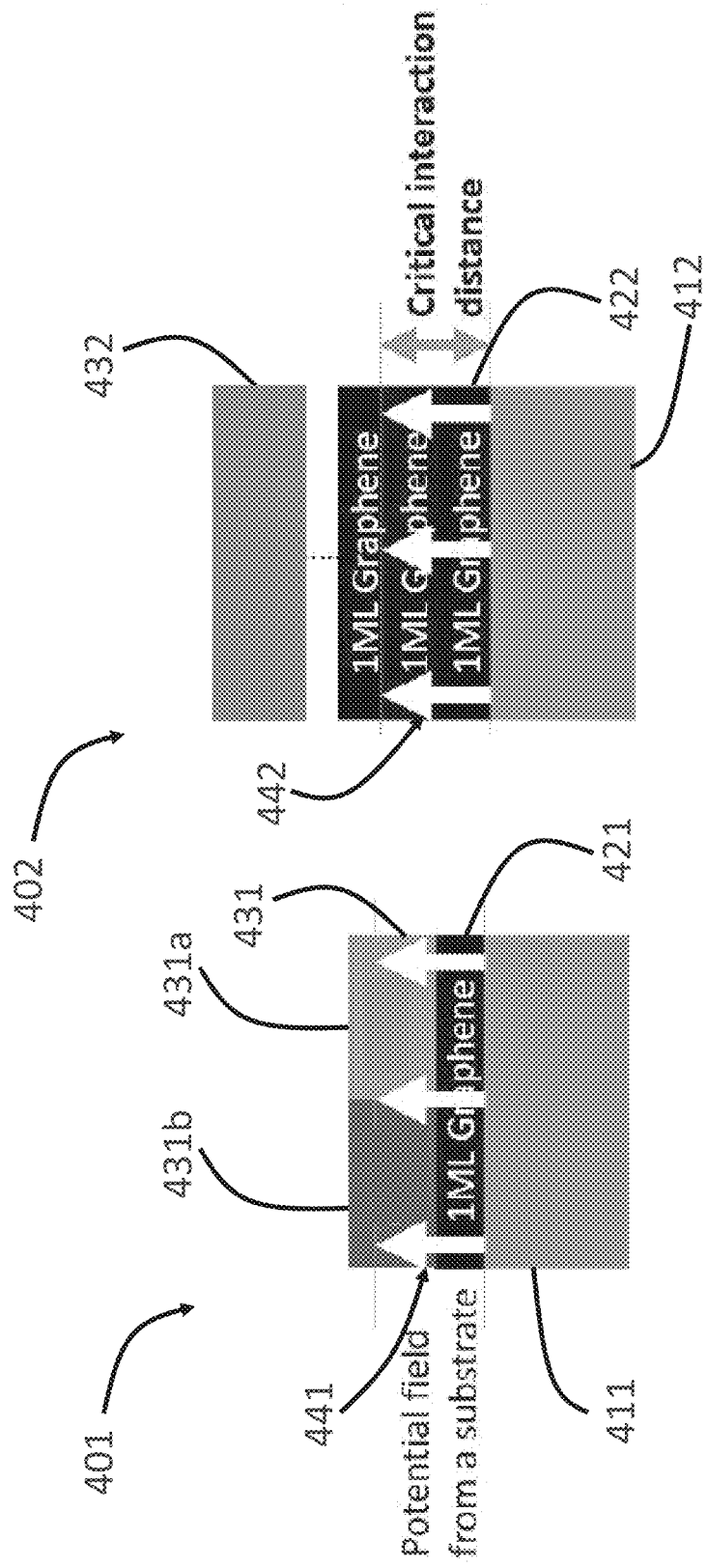
FIG. 4A-4B show the effects of graphene layer thickness and the underlying substrates on the growth of device layers on the graphene layer.

FIGS. 4A-4B show schematics of graphene-based fabrication systems to illustrate the effect of underlying substrates on the growth of device layers. FIG. 4A shows a system 401 including a substrate 411 and a graphene layer 421 disposed on the substrate 411. A device layer 431 is fabricated on the graphene layer 421. The substrate 411 has a potential field 441 (e.g., via van De Waals force or other atomic or molecular forces) indicated by arrows in FIG. 4A. In this case, the graphene layer 421 includes only a single monolayer of graphene (i.e., the graphene layer 421 is one atom thick) and the potential field 441 reaches beyond the graphene layer 421 and can interact with the device layer 431. As a result, the potential field 441, which depends on the material properties (such as crystalline orientation) of the substrate 411, can affect the growth of the device layer 431. At the same time, the graphene layer 421 also has its own potential field (not shown in FIG. 4A), which may similarly influence the growth of the device layer 431. The net result can be that the device layer 431 includes films 431a and 431b having two different orientations such as (100) and (111) orientations. Alternatively, the substrate force can be strong enough to overcome graphene field, in which case single-crystalline films that resembles substrates can be grown.

FIG. 4B shows a system 402 including a substrate 412 and a graphene layer 422 disposed on the substrate 412. A device layer 432 is fabricated on the graphene layer 422. The substrate 412 has a potential field 442 indicated by arrows in FIG. 4B. In contrast to the graphene layer 421 in FIG. 4A, the graphene layer 422 in FIG. 4B includes multiple stacks of monolayer graphene (i.e., the graphene layer 422 is more than one atom thick). Accordingly, the potential field 442 may interact only with the graphene layer 422 and may not reach the device layer 432. In other words, the VDWE of the device layer 432 occurs outside the potential field 442 of the substrate 412. In this case, the potential field of the graphene layer 422 affects the growth of the device layer 432.

FIGS. 4A-4B illustrate that the effect of the substrates (e.g., 411 and 412) on the growth of the device layers (e.g., 431 and 432) depend on the distance between them. In other words, the thickness of the graphene layers (e.g., 421 and 422) sandwiched between the substrates and the device layers determines the interaction strength. After a critical distance, the underlying substrates may not have any effect on the epitaxial growth of the device layers. This critical distance can be verified using high-resolution X-ray diffraction (HRXRD) to monitor the crystalline orientation of the epilayer as a function of graphene thicknesses, because the epilayer can resemble the graphene lattice beyond the critical distance.

FIGS. 5A-5E illustrate a method 500 of graphene-based layer transfer using thin graphene layers. In FIG. 5A, a donor wafer 510a is provided to grow a graphene layer 520 (shown in FIG. 5B). FIG. 5B shows that the graphene layer 520 is then transferred to a second wafer 510b, which can include III-N semiconductors, II-IV semiconductors, III-V semiconductors, and IV semiconductors.

In FIG. 5C, a film 530 is grown epitaxially above the graphene layer 520. Since the graphene layer 520 is sufficiently thin in this case, the growth of the film 530 is seeded by the second wafer 510b underneath the graphene layer 520. In FIG. 5D, a stressor 540 is deposited on the film 530 to facilitate subsequent layer transfer. The stressor 540 can include high stress metal materials such as nickel. In FIG. 5E, a tape layer 550 is disposed on the stressor 540 so as to handle the stressor 540 for releasing the film 530 from the graphene layer 520 and the second wafer 510b. In the method 500, the graphene layer 520 is thin enough and the graphene seeding effect can disappear while substrate seeding effect is strong. In this manner, one can make any releasable films via the method 500.

Figures 6A, 6B:
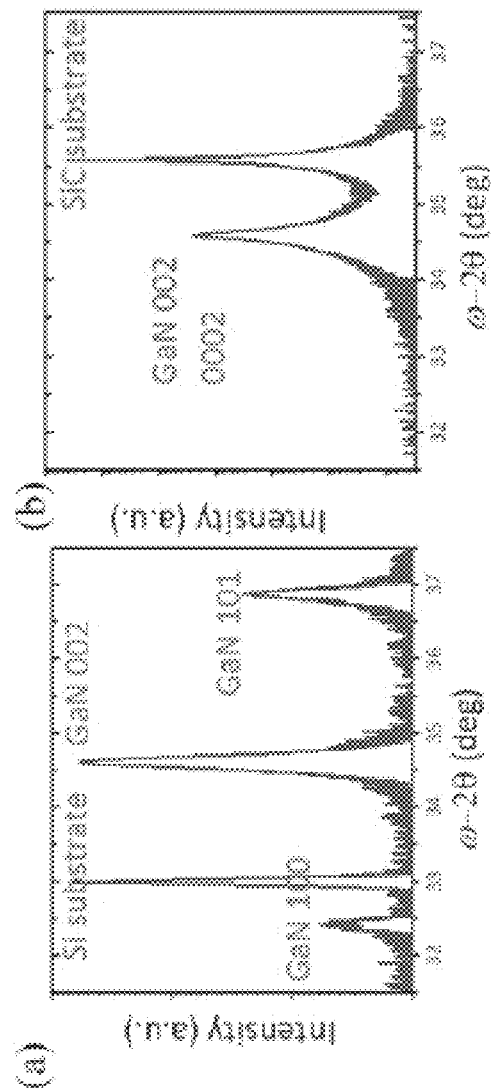
FIG. 6A shows high-resolution X-ray diffraction (HRXRD) scans of GaN grown on graphene disposed on $SiO_2$ substrate.
FIG. 6B shows HRXRD scans of GaN grown on graphene disposed on SiC substrate.

FIGS. 6A-6B show variations of crystallographic orientation of epilayers grown on graphene using different underlying substrates. FIG. 6A shows ω-2θ scans in HRXRD of GaN on graphene/SiO$_2$ (graphene on SiO$_2$ substrate). FIG. 6B shows ω-2θ scans of GaN on graphene/SiC (graphene on SiC substrate).

To eliminate the epitaxial relation between the epitaxial graphene and the SiC substrate, the epitaxial graphene as used in FIG. 6A can be exfoliated from the SiC and then transferred to amorphous SiO$_2$-coated Si substrates. Then GaN can be grown on the substrate. The HRXRD ω-2θ scan reveals that the GaN film grown on epitaxial graphene on top of SiO$_2$ is (0002)-textured polycrystalline, while the GaN film grown on epitaxial graphene on top of SiC has a single (0002) orientation (see FIG. 6A and FIG. 6B). This implies that the substrate right below the graphene layer plays a role in determining epitaxial orientation. Accordingly, the material (or the crystalline orientation) of the substrate can be employed to control the epitaxial orientation of the device layer.

Control of Seeding Locations in Graphene-Based Layer Fabrication and Transfer

In practical applications of graphene-based layer fabrication and transfer, it can be beneficial for the epitaxial registry to be tunable to either the graphene or the substrate so as to obtain high-quality single-crystalline films on graphene. With this control of the seeding location, direct epitaxy on the graphene or remote epitaxy seeded from the substrate can be achieved. In direct epitaxy on the graphene, graphene plays a role as a seed as well as a release layer. In remote epitaxy seeded from the substrate, graphene becomes a release layer only, while the substrate works as a seed.

Figures 7A, 7B, 7C:
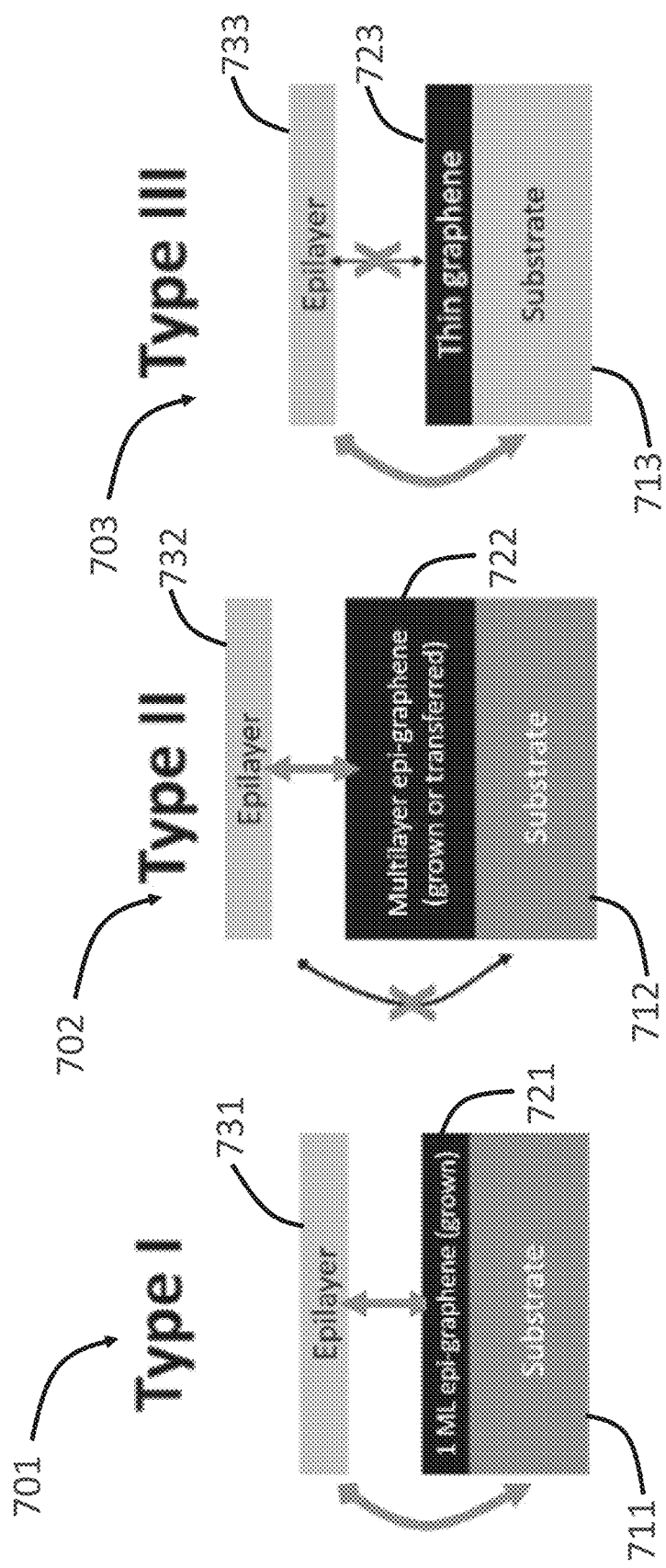
FIGS. 7A-7C illustrate three configurations of graphene-based fabrication techniques using graphene layers of different thicknesses.

FIGS. 7A-7C show schematics of three different types of graphene-based layer fabrication systems using graphene layers of different thicknesses. In applications, users can choose to use one of these systems based on the desired interaction strength between the device layer and the underlying substrate, or alternatively depending on the desired interaction strength between the device layer and the graphene. These three options can provide great flexibility to accommodate different fabrication tasks.

FIG. 7A shows a system 701 (also referred to as Type I system) including a substrate 711 and a graphene layer 721 grown on the substrate 711. An epilayer 731 is then grown on the graphene layer 721. In the type I system 701, both the graphene layer 721 and the substrate 711 interact with the epilayer 731, as indicated by the arrows in FIG. 7A.

In one example, the epitaxial graphene 721 (e.g., a monolayer graphene) can be grown on a SiC substrate for use in a type I system. In this example, because the crystallographic orientations of graphene and SiC are aligned, they can both offer a hexagonal seed for <0001> wurtzite structures. This substrate can be employed for growing single-crystalline wurtzite III-N (or SiC) films since the lattice mismatch between III-N semiconductors and graphene is small. This epitaxial graphene/SiC substrate can also be used to grow (111) cubic III-V, Si, and Ge films because both graphene and SiC become seeds for the (111) orientation.

In another example, the substrate 711 includes germanium (Ge) to epitaxially grow the graphene layer 721. The lattice mismatch between Ge and other cubic materials is typically smaller than the lattice mismatch between SiC and the cubic materials. In this example, the graphene layer 721 can be grown on the Ge substrate 711 via MOCVD techniques. In yet another example, graphene can be directly grown on other semiconductor wafers such as GaAs InP, and GaN.

FIG. 7B shows a system 702 (also referred to as Type II system) including a substrate 712 and a graphene layer 722 grown on the substrate 712. An epilayer 732 is then grown on the graphene layer 722. In the type II system 702, the thickness of the graphene layer 722 is substantially equal to or larger than the critical distance of interaction between the substrate 712 and the epilayer 732. Therefore, the epilayer 732 only interacts with the epitaxial graphene 722, which provides pure VDWE. This Type II system can be suitable to grow III-N semiconductor films or SiC single-crystalline films because its lattice mismatch to graphene is not substantially high. Copper foils can be used to fabricate polycrystalline graphene of large sizes (e.g., greater than 8", greater than 12", or more).

FIG. 7C shows a system 703 (also referred to as Type III system) including a substrate 713 and a graphene layer 723 grown on the substrate 713. An epilayer 733 is then grown on the graphene layer 723. In the type III system 703, the graphene layer 723 works only as a release layer and epitaxial growth is seeded only from the substrate 713. Substrate materials with the same or a similar lattice to the epilayer 733 can be used. The graphene layer 723 does not participate in determining the crystalline orientation of the epilayer 733. Accordingly, the graphene layer 723 can include either single-crystalline graphene or polycrystalline graphene.

The Type III system assigns registry of the epilayer 733 to the substrate. One advantage of this configuration is that high-quality epilayers can be grown on lattice-matching substrates just like in homoepitaxy, while the epilayers can be released from the graphene surface. To accomplish this, it can be desirable for the graphene layer 723 to be substantially transparent to the epilayer 733 during growth. This can be achieved by amorphizing or damaging the graphene via ions (e.g., via dry etching). The damages in the graphene layer 723 can allow direct interaction of the epilayer 733 and the substrate 713 through the graphene layer 723 such that the graphene layer 723 does not guide the crystalline orientation of the epilayer 733.

In one example, the substrate has polarity such as III-V substrates, III-N substrates, II-V substrates, and/or Ionic bonded substrate (e.g., Oxide, perovskite), pristine graphene can be transferred onto the wafer and epilayer can have the same crystallinity as that of the wafer and the grown film can be ready to be exfoliated. In another example, the substrate can have no polarity (e.g., group IV), damaging graphene can help promote substrate/epilayer interaction.

FIGS. 8A-8H illustrate a method 800 of graphene-based layer fabrication and transfer using graphene with periodic holes, which is referred to as porous graphene hereafter. The method 800 can be implemented with the Type III system, in which the graphene functions as a release layer and the substrate seeds the epitaxial growth of one or more functional layers.

Figures 8A, 8B, 8C, 8D:
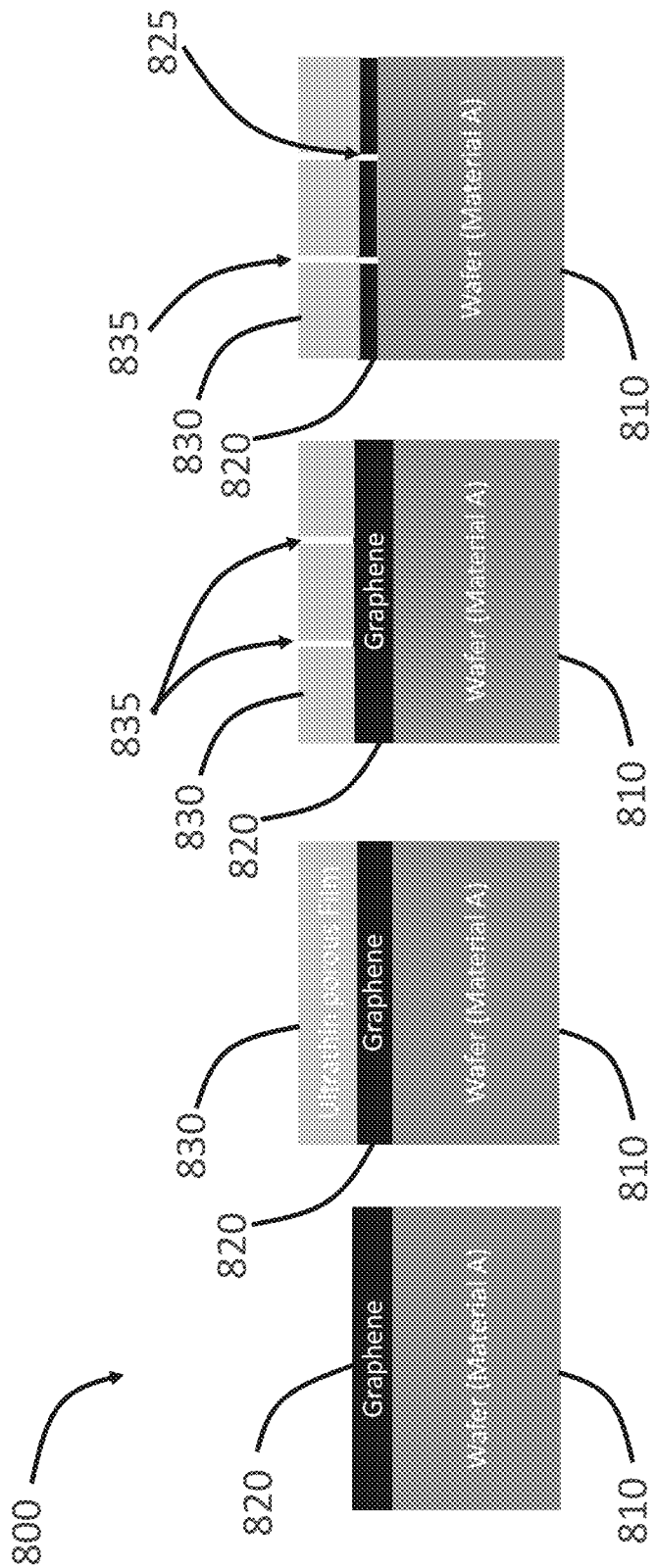

In FIG. 8A, a graphene layer 820 is disposed on a substrate 810. The graphene layer 820 can be grown on the substrate 810 via, for example, chemical vapor deposition. Alternatively, the graphene layer 820 can be transferred to the substrate 810. A porous film 830 (e.g., oxide, nitride, or photoresist film) is then disposed on the graphene layer 820 as shown in FIG. 8B. The porous film 830 has a high density of pinholes (e.g., about one hole per square micron). Alternatively, the porous film 830 can include any film with holes to allow subsequent processing shown in FIGS. 8C-8H.

In FIG. 8C, dry etching using Ar plasma or $O_2$ plasma is carried out to open up the pinholes in the porous film 830. This etching creates a plurality of holes 835 in the porous film 830, allowing the ions in the etching plasma to transmit through the porous film 830 and arrive at the graphene layer 820. The etching plasma then etches the portion of the graphene layer 820 directly underneath the pinholes 835 in the porous film 830. Ions in the etching plasma can damage the graphene layer 820 by creating a plurality of holes 825 in the graphene layer 820, which now becomes a porous graphene layer 820. In one example, the etching of the porous film 830 and the etching of the graphene layer 820 can be achieved with the same etching plasma. In another example, the etching of the porous film 830 and the etching of the graphene layer 820 can be achieved with different etching plasmas.

In FIG. 8E, the porous film 830 is removed, leaving the now-porous graphene layer 820 exposed to further processing. In one example, the porous film 830 includes photoresist material and can be removed by acetone. In another example, the porous film 830 includes oxide or nitride and can be removed by hydrogen fluoride (HF). FIG. 8E also shows that an epilayer 840 is grown on the porous graphene layer 820. The growth starts from the area where the holes 825 were created. The holes 825 allow direction interaction of the substrate 810 with the epilayer 840, thereby allowing the substrate 810 to guide the crystalline orientation of the epilayer 840. The growth of the epilayer 840 then extends to cover the entire graphene layer 820, forming a planar epilayer 840.

In FIG. 8G, the formed epilayer 840 is released from the graphene layer 820 and the substrate 810. The released epilayer 840 is transferred to a target substrate 850, as shown in FIG. 8H, for further processing, such as forming a functional device. The graphene layer 820 and the substrate 810, after the release of the epilayer 840 shown in FIG. 8G, is then reused to fabricate another epilayer, and the cycle can be repeated multiple times.

Figure 9B:
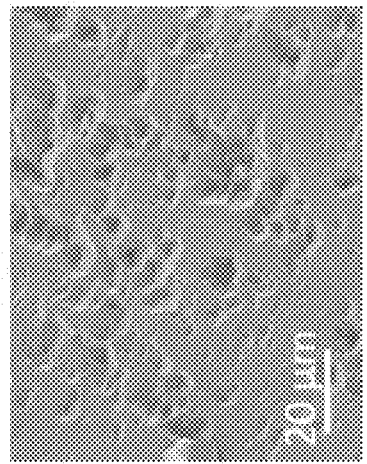
FIGS. 9A and 9B are scanning electron microscope (SEM) images of Ge and GaAs epilayers, respectively, grown on damaged graphene.
Figure 9A:
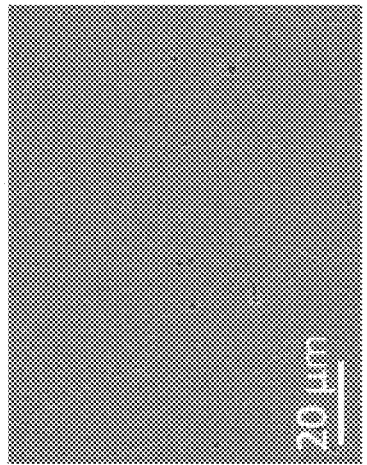

FIGS. 9A and 9B are scanning electron microscopy (SEM) images of the Ge and GaAs films, respectively, grown on damaged graphene. Although pits appear on the surface due to limited nucleation on the graphene and incomplete impingement of the growth fronts, planar (100) crystals completely seeded from the substrate are observed.

Figure 10B:
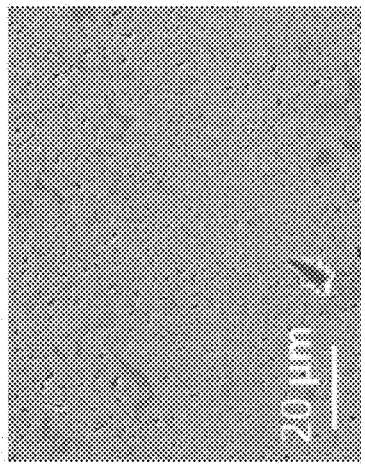
FIGS. 10A and 10B are SEM images of the Ge and GaAs epilayers shown in FIGS. 9A and 9B, respectively, after release from the substrate.
Figure 10A:
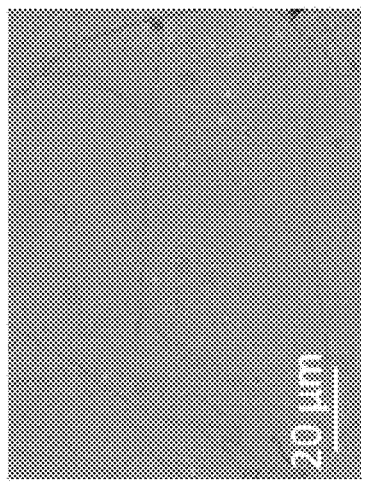

FIGS. 10A and 10B are SEM images of the Ge and GaAs films shown in FIGS. 9A and 9B, respectively, after being exfoliated using a Ni stressor. The smooth exfoliated surface implies precise release of the layer from the graphene, and this is confirmed by observing the trace of graphene-like wrinkles during wet transfer.

This porous graphene approach as illustrated in FIGS. 8A-8H and experimentally investigated in FIGS. 9A-9B and FIGS. 10A-10B can be applied to several other material systems. In one example, InP films can be fabricated on damaged graphene disposed on InP wafers. In another example, Si films can be grown on damaged graphene disposed on Si wafers. In yet another example, GaN films can be grown on damaged graphene disposed on GaN wafers. The epitaxial registry of the epilayer can be tuned to the substrate to secure successful epitaxial growth through the graphene onto the substrate.

Fabrication of Functional Flexible Devices and Hetero-Integration

The graphene-based layer fabrication and transfer technique can be used to fabricate various functional devices based on the epilayers grown on graphene. In one example, III-N high electron mobility transistors (HEMTs) can be fabricated from III-N epilayers. The transistors can then be transferred to a polycrystalline diamond substrate for heat dissipation. GaN power devices can also be constructed from these films. In another example, flexible GaAs solar cells can be fabricated from III-V epilayers. Optoelectronic devices integrated with Si integrated circuits can also be constructed from III-V epilayers. In yet another example, Ge-based LEDs and photodetectors can be fabricated by growing IV epilayers on graphene, exfoliating them, stretching the freestanding Ge to tensile-strained Ge, and transferring them to Si integrated circuits. In yet another example, Ge can be grown on 12" Si wafer and then used as a seed to grow single-crystalline graphene. Then III-V optoelectronic materials can be grown on graphene on Ge/Si wafers without any dislocations.

FIGS. 11A-11H illustrate a method 1100 of fabricating light emitting diodes (LEDs) using graphene-based layer transfer techniques described above. In FIG. 11A, a graphene layer 1120 is grown on a substrate 1110 (e.g., a 6" SiC substrate). Then the graphene layer 1120 is released from the substrate 1110, as shown in FIG. 11B, and transferred to a target substrate 1130, as shown in FIG. 11C. The target substrate 1130 can be less expensive than, for example, the SiC wafer used in FIG. 11A.

In FIG. 11D, an LED stack 1140 (e.g., a visible LED stack) is fabricated on the graphene layer 1120. In this example, the LED stack 1140 includes three periods of III-nitride multi-quantum wells (InGaN well and GaN barrier) sandwiched between p-GaN and n-GaN layers. As readily appreciated by those of skill in the art, other types of LED stacks can also be grown on the graphene layer 1120.

The fabricated LED stack 1140 can then be processed in at least two ways. In one way, as illustrated in FIG. 11E, an electrode 1150 can be deposited on the LED stack 1140 to form an electrical contact. For example, thin Ni/Au (5 nm/5 nm) can be deposited on the LED stack 1140 and then annealed at 500° C. for 10 min. This yields an LED that includes the substrate 1130.

Alternatively, as illustrated in FIG. 11F, the LED stack 1140 may be removed from the substrate 1130. To remove the LED stack 1140 from the substrate 1130, a stressor layer 1160 is disposed on the LED stack 1140 to release the LED stack 1140 from the target substrate 1130 and the graphene 1120. Then, the combination of stressor layer 1160 and the LED stack 1140 is flipped and placed on a second target substrate 1135, as shown in FIG. 11G. The stressor layer 1160 is in contact with the second target substrate 1135 and the LED stack 1140 is exposed for further processing. For example, FIG. 11G shows that LED mesas 1145 are etched from the LED stack 1140. In FIG. 11F, additional electrical contacts 1170 are integrated with the LED mesas 1145 and the stressor layer 1160.

In one example, the graphene layer 1120 can seed the growth of the LED stack 1140 and the target substrate 1130 may not have any effect on the growth of the LED stack 1140. In another example, type III seeding (e.g., illustrated in FIG. 7C) can be used. In this case, the graphene layer 1120 can be thin and the target substrate 1130 can seed the growth of the LED stack 1140. The target substrate 1130 can include GaN substrates.

FIGS. 12A-12G illustrate a method 1200 of fabricating GaAs solar cells using graphene-based layer transfer technique. In FIG. 12A, a graphene layer 1220 (e.g. a single-crystalline graphene layer) is fabricated on a substrate 1210 (e.g., a 6" SiC wafer). Then the graphene layer 1220 is transferred to a target substrate 1230 as seen in FIG. 12B. FIG. 12C shows that a GaAs solar cell 1240 is fabricated on the graphene layer 1220 via, for example, epitaxial growth techniques known in the art. FIG. 12D shows that a stressor layer 1250 is then deposited on the solar cell 1240 to facilitate subsequent device transfer. A tape layer 1260 is disposed on the stressor 1250 to help handle the device transfer as seen in FIG. 12E.

After release from the target substrate 1230, the solar cell 1240 becomes free standing and can be processed in two ways. In one way, as illustrated in FIG. 12F, the solar cell 1240 can be placed on metal 1240 for subsequent module fabrication. The solar cell 1240 can be placed on the metal 1240 via direct bonding or any other techniques known in the art. Alternatively, as illustrated in FIG. 12G, the free standing solar cell 1240, together with the stressor layer 1250 and the tape layer 1260, form a lightweight and flexible solar cell assembly in their own. This flexible solar cell assembly can be easily integrated into other systems, including power electronic devices.

In one example, the graphene layer 1220 can seed the growth of the solar cell 1240 and the target substrate 1230 may not have any effect on the growth of the solar cell 1240. In another example, type III seeding (e.g., illustrated in FIG. 7C) can be used. In this case, the graphene layer 1220 can be thin and the target substrate 1230 can seed the growth of the solar cell 1240. The target substrate 1230 can include GaAs substrates.

Figures 13A, 13B, 13C:
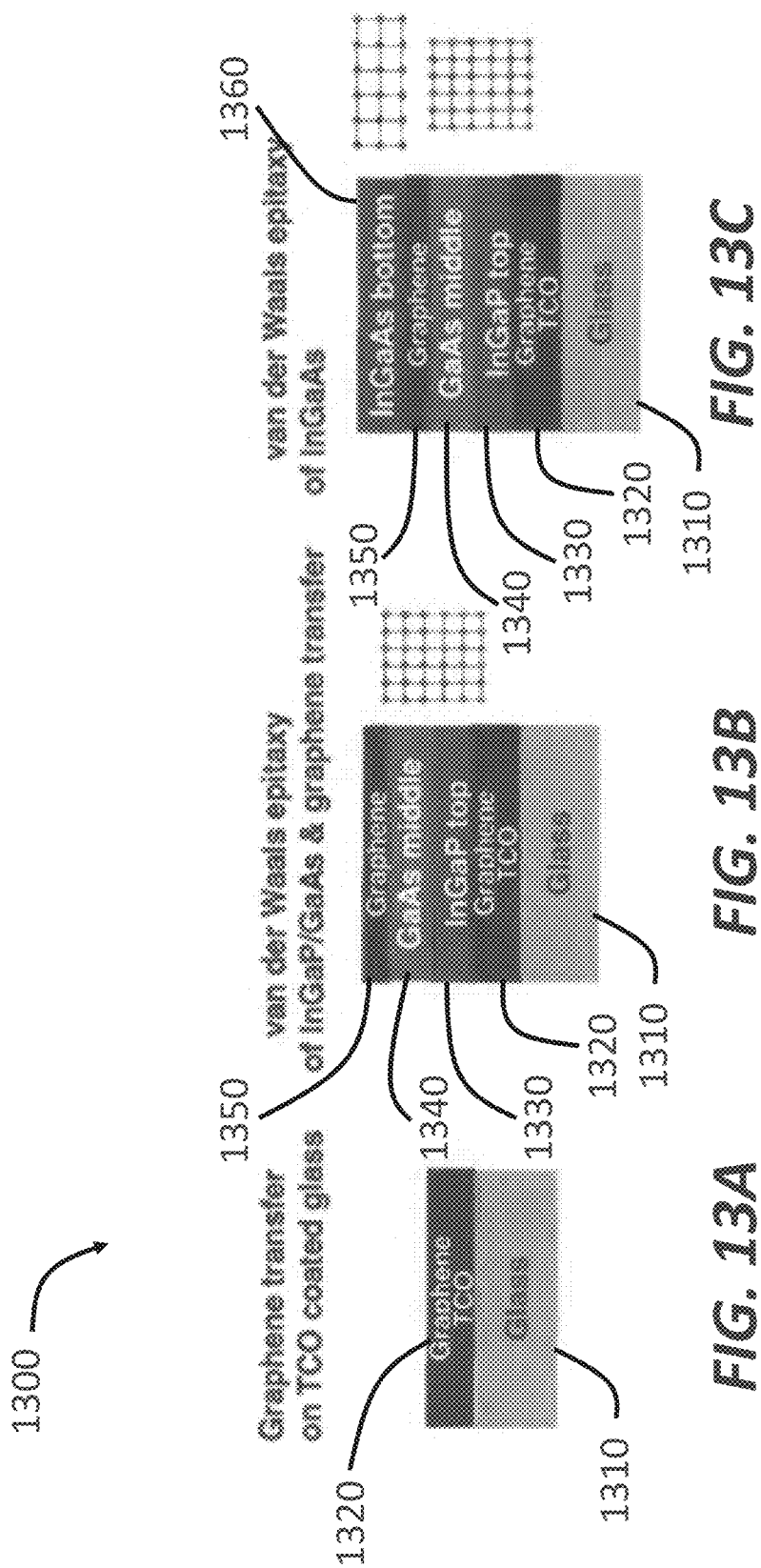
FIGS. 13A-13E illustrate a method of fabrication multi junction solar cells using a graphene-based layer fabrication and transfer technique.

FIGS. 13A-13E illustrate a method 1300 of fabricating multi junction solar cells using graphene-based layer transfer technique. The method 1300 starts by disposing a graphene layer 1320 on a glass substrate 1310 having a transparent conductive oxide (TCO) surface, as shown in FIG. 13A. The graphene layer 1320 can be transferred to the glass substrate 1310 via any method described in this application or any other method known in the art.

Figures 13D, 13E:
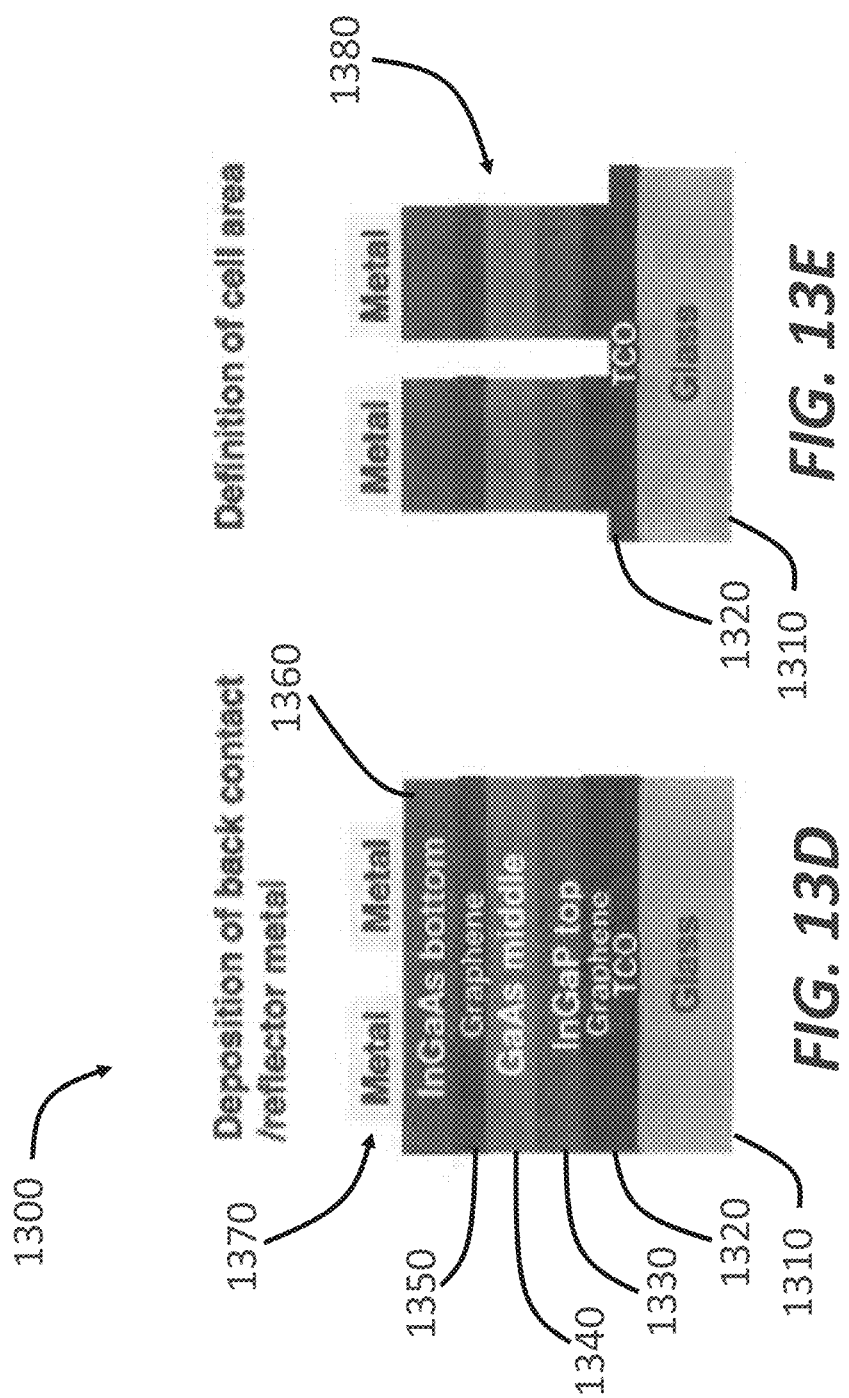

FIG. 13B shows that three material layers are deposited on the graphene layer 1320, including an InGaP layer 1330, a GaAs layer 1340 on the InGaP layer 1330, and a second graphene layer 1350 on the GaAs layer 1340. FIG. 13C shows that an InGaAs layer 1360 is deposited on the second graphene layer 1350. The second graphene layer 1350 can help lattice-matching during the fabrication of the InGaAs layer 1360. Metal contacts 1370 are then placed on the InGaAs layer 1360 for electrical conduction, as shown in FIG. 13D. Then in FIG. 13E, the stack of InGaP layer 1330, the GaAs layer 1340, the second graphene layer 1350, and the InGaAs layer 1350 are etched into two solar cell mesas 1380, each of which is underneath a respective metal contact 1370.

FIGS. 14A-14C illustrate a method 1400 of fabricating transistors. In FIG. 14A, a graphene layer 1420 is disposed on a substrate 1410 such as a SiC wafer. An InGaAs layer 1430 is deposited on the graphene layer 1420. Then the InGaAs layer 1430 is transferred to a silicon wafer 1440 with an oxide layer 1450 disposed on the surface of the silicon wafer 1440, as shown in FIG. 14B. An $Al_2O_3$ layer 1470 is then deposited on the InGaAs layer 1430 as the top gate dielectric. A gate 1480 is fabricated on the $Al_2O_3$ layer 1470 to form a transistor, as shown in FIG. 14C.

In one example, the graphene layer 1420 can seed the growth of the InGaAs layer 1430 and the silicon wafer 1440 may not have any effect on the growth of the InGaAs layer 1430. In another example, type III seeding (e.g., illustrated in FIG. 7C) can be used. In this case, the graphene layer 1420 can be thin and the silicon wafer 1440 be replaced by an InP substrate so as to seed the growth of the InGaAs layer 1430.

Figures 15A, 15B, 15C:
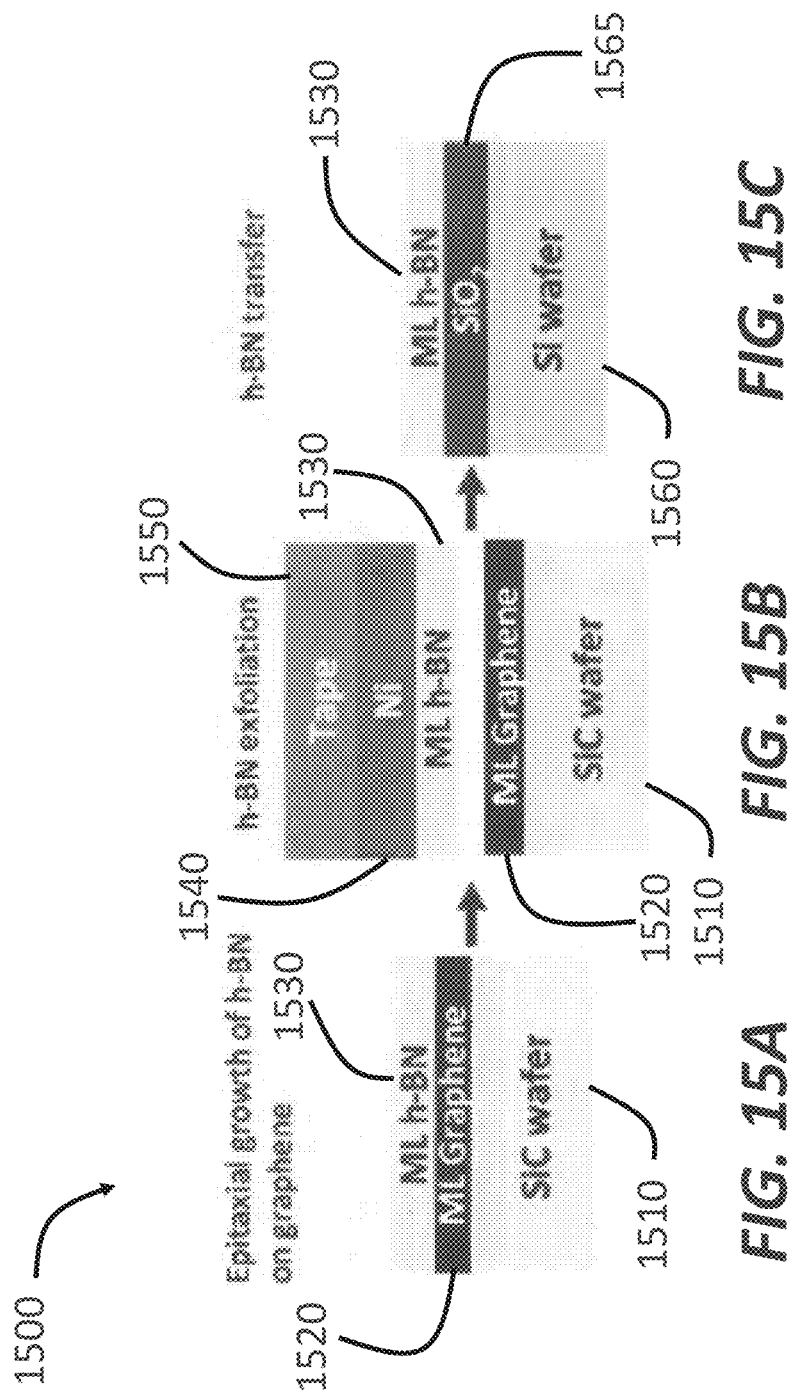

FIGS. 15A-15F illustrate a method 1500 of forming heterostructure using graphene-based layer transfer technique. In FIG. 15A, a graphene layer 1520 (e.g., a monolayer graphene) is disposed on a substrate 1510 such as a SiC wafer. An h-BN layer 1530 (i.e., hexagonal form boron nitride) is then epitaxially grown on the graphene layer 1520. FIG. 15B shows that a stressor layer 1540 (e.g., a nickel film) is coated on the h-BN layer 1530 and a tape layer 1550 is disposed on the stressor layer 1540. As described before, the tape layer 1550 and the stressor layer 1540 can transfer the h-BN layer 1530 to a second substrate including a silicon wafer 1560 with an oxide layer 1565 (e.g., silicon oxide) on the top, as illustrated in FIG. 15C. FIG. 15C also shows that the stressor layer 1540 and the tape layer 1550 are etched away, leaving the h-BN layer 1530 for further processing.

In FIG. 15D, a $MoS_2$ layer 1570 is deposited on the h-BN layer 1530, and a second h-BN layer 1580 is deposited on the $MoS_2$ layer 1570 so as to form h-BN/$MoS_2$ heterostructure. FIG. 15F shows that an $HfO_3$ layer 1590 is deposited on the second h-BN layer 1580 as top gate dielectric and a top gate 1595 is deposited on the $HfO_3$ layer 1590 for electrical conduction.

Figures 16A, 16B, 16C:
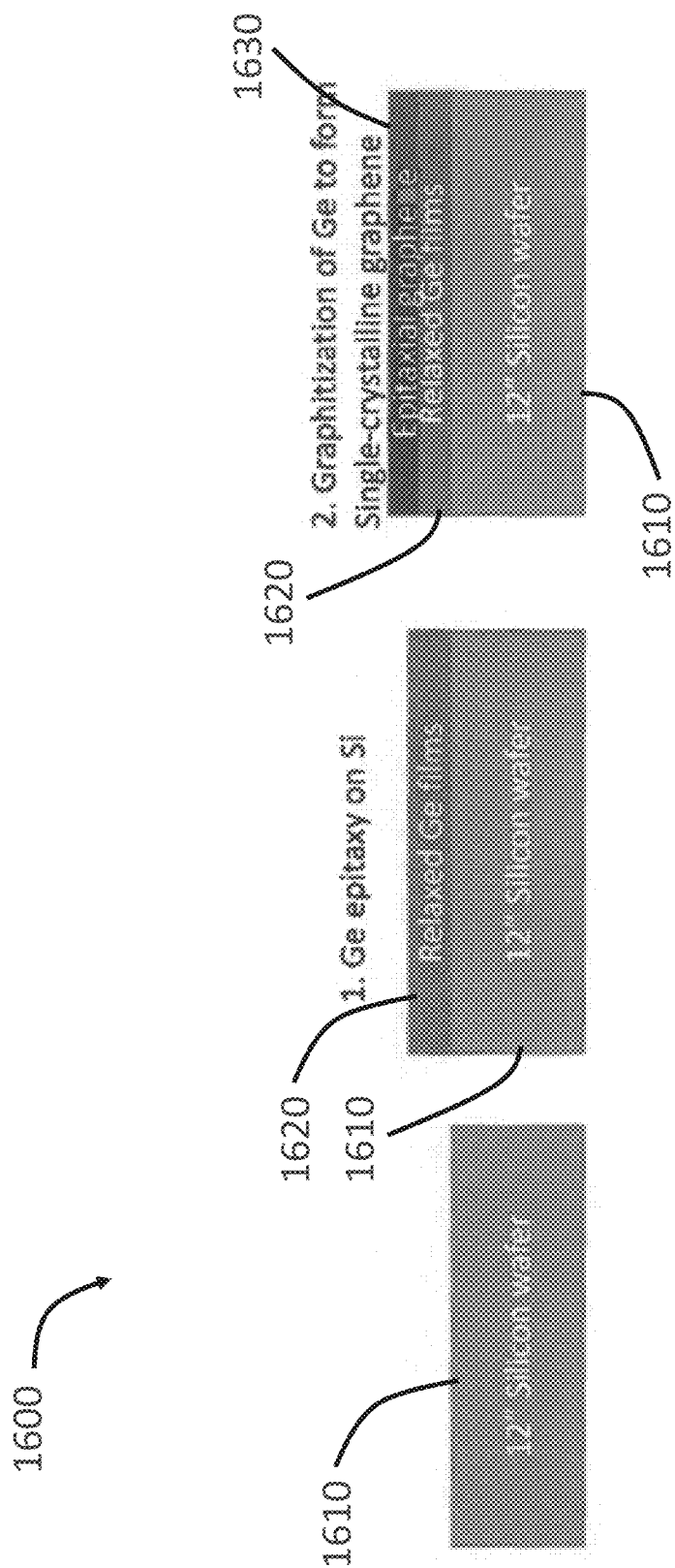
FIGS. 16A-16F illustrate a method of preparing a platform for fabricating III-V devices using a graphene-based layer fabrication and transfer technique.

FIGS. 16A-16F illustrate a method 1600 of preparing a platform for fabricating III-V devices using graphene-based layer fabrication and transfer technique. FIG. 16A shows a 12" silicon wafer 1610. A relaxed Ge film 1620 is then disposed on the wafer 1610 via, for example, epitaxial growth, as shown in FIG. 12B. The Ge film 1620 then functions as seed to grow a graphene layer 1630 epitaxially, as seen in FIG. 16C. The graphene layer 1630 can include single crystalline graphene.

Figures 16D, 16E, 16F:
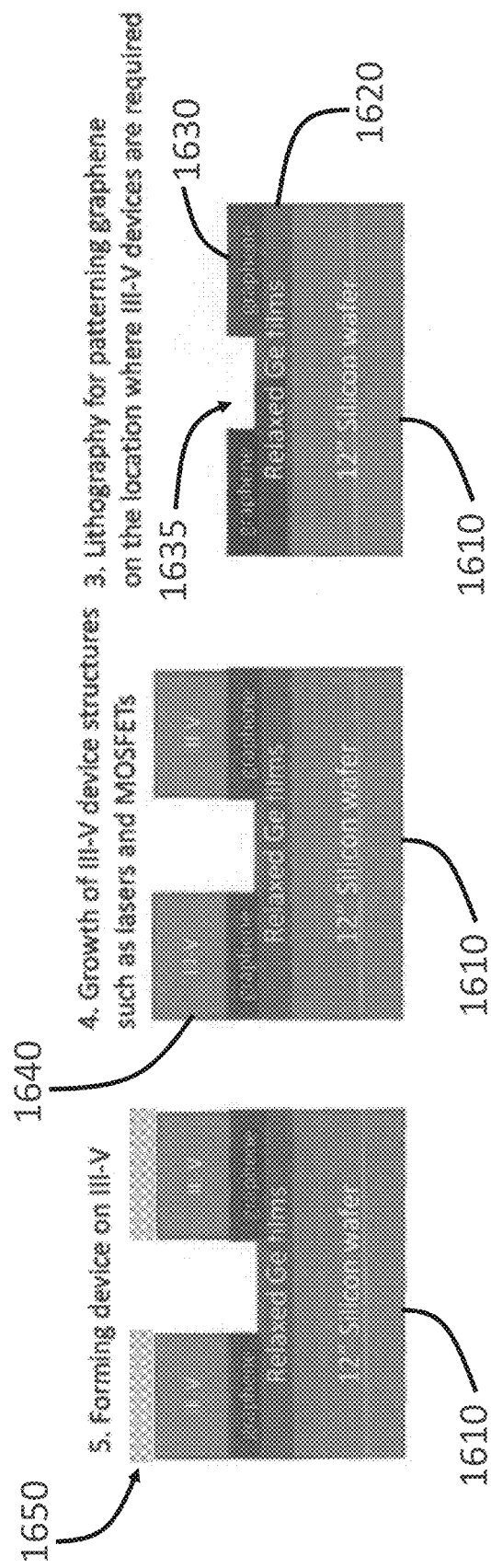

In FIG. 16D, the graphene layer 1630 is pattered via, for example, lithography techniques known in the art. The patterning results in gaps 1635 in the graphene layer 1630. In other words, the graphene layer 1630 can be patterned into isolated and smaller pieces of graphene layers. In FIG. 16E, device layers 1640 are fabricated on the graphene layer 1620. The device layers 1640 can include, for example, III-V materials or structures such as metal-oxide-semiconductor field-effect transistor (MOSFET), lasers, or any other structure known in the art. The devices layers 1640 then function as platforms to form additional devices 1650, as shown in FIG. 1610.

Conclusion

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of designing and making the technology disclosed herein may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes (outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method, comprising:
forming a single-crystalline film on a continuous graphene layer that is on a substrate, wherein forming the single-crystalline film on the graphene layer comprises using the substrate as a seed for the single-crystalline film; and
separating the single-crystalline film and the substrate.

2. The method of claim 1, further comprising forming the graphene layer on the substrate.

3. The method of claim 2, wherein forming the graphene layer on the substrate comprises growing the graphene layer on the substrate.

4. The method of claim 2, wherein the substrate is a first substrate, and forming the graphene layer on the first substrate comprises transferring the graphene layer from a second substrate to the first substrate.

5. The method of claim 1, wherein the graphene layer is one of a plurality of graphene layers, and forming the single-crystalline film comprises forming the single-crystalline film on the plurality of graphene layers.

6. The method of claim 1, wherein the graphene layer is the only graphene layer between the single-crystalline film and the substrate.

7. The method of claim 1, wherein the graphene layer is a single-crystalline graphene layer.

8. The method of claim 1, wherein the graphene layer is a polycrystalline graphene layer.

9. The method of claim 1, wherein, during the separating, the graphene layer is used as a release layer.

10. The method of claim 1, wherein forming the single-crystalline film on the graphene layer comprises using a combination of the substrate and the graphene layer as a seed for the single-crystalline film.

11. The method of claim 1, wherein forming the single-crystalline film comprises depositing material of the substrate on the graphene layer.

12. The method of claim 1, wherein separating the single-crystalline film and the substrate comprises exfoliating the single-crystalline film.

13. The method of claim 1, wherein separating the single-crystalline film and the substrate comprises:
forming a metal stressor on the single-crystalline film;
disposing a flexible tape on the metal stressor; and
pulling the single-crystalline film and the metal stressor off the graphene layer with the flexible tape.

14. The method of claim 1, wherein the single-crystalline film is a first single-crystalline film, and further comprising forming a second single-crystalline film on the substrate after the first single-crystalline film and the substrate have been separated.

15. The method of claim 1, wherein the single-crystalline film comprises a semiconductor material.

16. The method of claim 1, wherein the substrate is a semiconductor substrate.

17. The method of claim 1, wherein the graphene layer is directly on the substrate.

18. The method of claim 1, wherein the single-crystalline film comprises SiC.

19. A method, comprising:
forming a single-crystalline film on a graphene layer that is on a substrate having a potential field, wherein the potential field of the substrate reaches beyond the graphene layer to seed the growth of the single-crystalline film; and
separating the single-crystalline film and the substrate.

20. The method of claim 19, wherein the single-crystalline film is a first single-crystalline film, and further comprising forming a second single-crystalline film on the substrate after the first single-crystalline film and the substrate have been separated.

21. The method of claim 19, wherein the single-crystalline film comprises a semiconductor material.

22. The method of claim 19, wherein the substrate is a semiconductor substrate.

23. The method of claim 19, wherein the single-crystalline film comprises SiC.

\* \* \* \* \*